(12) United States Patent
Yamazaki et al.

(10) Patent No.: US 7,722,919 B2
(45) Date of Patent: May 25, 2010

(54) MANUFACTURING METHOD OF EMITTING DEVICE

(75) Inventors: Shunpei Yamazaki, Tokyo (JP); Masakazu Murakami, Kanagawa (JP); Ryoji Nomura, Kanagawa (JP); Satoshi Seo, Kanagawa (JP)

(73) Assignee: Semiconductor Energy Laboratory Co., Inc. (JP)

( * ) Notice: Subject to any disclaimer, the term of this patent is extended or adjusted under 35 U.S.C. 154(b) by 1011 days.

(21) Appl. No.: 10/705,604

(22) Filed: Nov. 10, 2003

(65) Prior Publication Data
US 2005/0101064 A1 May 12, 2005

(30) Foreign Application Priority Data
Nov. 11, 2002 (JP) .............................. 2002-327373

(51) Int. Cl.
*B05D 5/06* (2006.01)
(52) U.S. Cl. ...................... 427/66; 427/256; 427/294; 427/421.1; 427/427.4
(58) Field of Classification Search .................. 427/66, 427/256, 294, 421.1, 427.4
See application file for complete search history.

(56) References Cited

U.S. PATENT DOCUMENTS

| 3,060,429 | A | 10/1962 | Winston |
| 3,147,142 | A | 9/1964 | Rudo |
| 3,416,153 | A | 12/1968 | Hertz |
| 3,596,275 | A | 7/1971 | Sweet |
| 3,747,120 | A | 7/1973 | Stemme |
| 3,946,398 | A | 3/1976 | Kyser et al. |
| 4,138,284 | A | 2/1979 | Postupack |
| 4,226,182 | A | 10/1980 | Danielsen et al. |
| 4,620,196 | A | 10/1986 | Hertz et al. |
| 4,928,125 | A | 5/1990 | Iino |
| 5,247,190 | A | 9/1993 | Friend et al. |

(Continued)

FOREIGN PATENT DOCUMENTS

EP 0 854 024 A2 7/1998

(Continued)

OTHER PUBLICATIONS

Schenk, H. et al., "Polymers for Light Emitting Diodes," EuroDisplay '99: Proceedings of the 19th IDRC (International Display Research Conference), Berlin, Germany, Sep. 6, 1999, pp. 33-37.

(Continued)

*Primary Examiner*—Katherine A Bareford
*Assistant Examiner*—Jimmy Lin
(74) *Attorney, Agent, or Firm*—Husch Blackwell Sanders

(57) ABSTRACT

The present invention is a fabrication method of a light-emitting device characterized by ejecting a solution containing a luminescent material toward an anode or a cathode under a reduced pressure and characterized in that in a duration before the solution is arrived at the anode or the cathode, the solvent in the solution is volatilized, the remaining part of the luminescent material is deposited on the anode or the cathode, and thereby formed a light-emitting layer. By the present invention, a baking process for thickness reduction is not required after applying the solution. Accordingly, it is possible to provide a fabrication method with high throughput although the method is low in cost and simple.

12 Claims, 15 Drawing Sheets

U.S. PATENT DOCUMENTS

| | | | |
|---|---|---|---|
| 5,264,376 A | 11/1993 | Abbott et al. | |
| 5,344,676 A | 9/1994 | Kim et al. | |
| 5,399,502 A | 3/1995 | Friend et al. | |
| 5,583,552 A | 12/1996 | Mutoh | |
| 5,584,739 A | 12/1996 | Itoh et al. | |
| 5,678,116 A | 10/1997 | Sugimoto et al. | |
| 5,811,020 A | 9/1998 | Alwan | |
| 5,895,932 A | 4/1999 | Bojarczuk, Jr. et al. | 257/103 |
| 5,898,185 A | 4/1999 | Bojarczuk, Jr. et al. | 257/103 |
| 5,916,729 A | 6/1999 | Kobayashi et al. | |
| 5,952,037 A | 9/1999 | Nagayama et al. | |
| 6,022,104 A | 2/2000 | Lin | 347/102 |
| 6,023,073 A | 2/2000 | Strite | 257/40 |
| 6,211,538 B1 | 4/2001 | Park | |
| 6,245,393 B1 | 6/2001 | Thompson et al. | |
| 6,252,246 B1 | 6/2001 | Arai et al. | 257/40 |
| 6,280,273 B1 | 8/2001 | Codama | |
| 6,300,021 B1 | 10/2001 | Gorog et al. | |
| 6,310,665 B1 | 10/2001 | Kido | |
| 6,319,321 B1 | 11/2001 | Hiraga et al. | 118/666 |
| 6,348,359 B1 | 2/2002 | Van Slyke et al. | |
| 6,369,507 B1 | 4/2002 | Arai | |
| 6,403,392 B1 | 6/2002 | Burrows et al. | |
| 6,511,545 B2 | 1/2003 | Banno et al. | |
| 6,593,690 B1 * | 7/2003 | McCormick et al. | 313/506 |
| 6,696,105 B2 | 2/2004 | Hiroki et al. | |
| 6,821,553 B2 | 11/2004 | Miyashita et al. | |
| 6,843,937 B1 | 1/2005 | Kiguchi et al. | |
| 6,858,464 B2 | 2/2005 | Yamazaki et al. | |
| 6,864,638 B2 | 3/2005 | Ishihara et al. | |
| 6,882,102 B2 | 4/2005 | Yamazaki | |
| 7,141,817 B2 | 11/2006 | Nishi et al. | |
| 7,176,617 B2 | 2/2007 | Endo et al. | |
| 2001/0017409 A1 | 8/2001 | Hiroki et al. | 257/723 |
| 2002/0024051 A1 | 2/2002 | Yamazaki et al. | |
| 2002/0030443 A1 * | 3/2002 | Konuma et al. | 313/504 |
| 2002/0031874 A1 | 3/2002 | Yamazaki et al. | |
| 2002/0075422 A1 | 6/2002 | Kimura et al. | 349/43 |
| 2002/0155215 A1 * | 10/2002 | Miyashita et al. | 427/66 |
| 2002/0164416 A1 * | 11/2002 | Yamazaki | 427/66 |
| 2003/0122127 A1 | 7/2003 | Yonekura et al. | |
| 2003/0166311 A1 * | 9/2003 | Miyazawa | 438/82 |
| 2003/0221620 A1 | 12/2003 | Yamazaki | |
| 2005/0147739 A1 | 7/2005 | Yamazaki et al. | |
| 2007/0122937 A1 | 5/2007 | Yamazaki et al. | |
| 2007/0218797 A1 | 9/2007 | Yamazaki et al. | |

FOREIGN PATENT DOCUMENTS

| | | |
|---|---|---|
| EP | 0 862 156 | 9/1998 |
| EP | 0 875 382 | 11/1998 |
| EP | 1 128 449 A2 | 8/2001 |
| GB | 2360489 * | 9/2001 |
| JP | 64-82966 | 3/1989 |
| JP | 4-220351 | 8/1992 |
| JP | 6-182980 | 7/1994 |
| JP | 06-182980 * | 7/1994 |
| JP | 10-012377 | 1/1998 |
| JP | 10-202153 | 8/1998 |
| JP | 10-214682 | 8/1998 |
| JP | 10-309803 | 11/1998 |
| JP | 10-335061 | 12/1998 |
| JP | 11-54270 | 2/1999 |
| JP | 11-54272 | 2/1999 |
| JP | 2000-268967 | 9/2000 |
| JP | 2000-294375 | 10/2000 |
| JP | 2001-006875 | 1/2001 |
| JP | 2001-276726 * | 10/2001 |
| JP | 2001-345176 | 12/2001 |
| JP | 2002-055220 | 2/2002 |
| JP | 2003-264072 * | 9/2003 |
| WO | WO 98/12689 | 3/1998 |

OTHER PUBLICATIONS

Tsutsu, T. et al., "Electroluminescence in Organic Thin Films," Photochemical Processes in Organized Molecular Systems, 1991, pp. 437-450.

Baldo, M.A. et al., "Highly Efficient Phosphorescent Emission from Organic Electroluminescent Devices," Nature, vol. 395, Sep. 10, 1998, pp. 151-154.

Baldo, M.A. et al., "Very High-Efficiency Green Organic Light-Emitting Devices Based on Electrophosphorescence," Appl. Phys. Lett. (Applied Physics Letters), vol. 75, No. 1, Jul. 5, 1999, pp. 4-6.

Tsutsui, T. et al., "High Quantum Efficiency in Organic Light-Emitting Devices with Iridium—Complex as a Triplet Emissive Center," Jpn. J. Appl. Phys. (Japanese Journal of Applied Physics), vol. 38, part.2, No. 12B, Dec. 15, 1999, pp. L1502-L1504.

Shimoda, T. et al., "Technology for Active Matrix Light Emitting Polymer Displays," IEDM 99: Technical Digest of International Electron Devices Meeting, 1999, pp. 107-110.

Kimura, M. et al., "Low-Temperature Poly-Si TFT Driven Light-Emitting-Polymer Displays and Digital Gray Scale for Uniformity," IDW '99: Proceedings of the 6th International Display Workshops, 1999, pp. 171-174.

Sweet, R.G. "High Frequency Recording with Electrostatically Deflected Ink Jets," Rev. Sci. Instrum, (Review of Scientific Instruments), vol. 36, No. 2, Feb. 1, 1965, pp. 131-136.

Pimbley, W.T. et al., "Satellite Droplet Formation in a Liquid Jet," IBM J. Res. Develop. (IBM Journal of Research and Development), vol. 21, No. 1, 1977, pp. 21-30.

Hertz, C.H. et al., "Ink Jet Printing of High Quality Color Images," Journal of Imaging Technology, vol. 15, No. 3, Jun. 3, 1989, pp. 141-148.

Hunter, I.M, et al., "Design of an Active Matrix Polymer-LED Display with Reduced Horizontal Cross-Talk," IDW '99: Proceedings of the 6th International Display Workshops, 1999, pp. 1095-1096.

Lee, J-D et al., "Two-Dimensional Nozzle Arrangement in a Monolithic Inkjet Printhead for High-Resolution and High-Speed Printing," IEDM 99: Technical Digest of International Electron Devices Meeting, 1999, pp. 127-130.

International Search Report re Int. Application No. PCT/JP03/14085, mailed Mar. 23, 2004 (with partial English translation).

* cited by examiner

FIG. 1
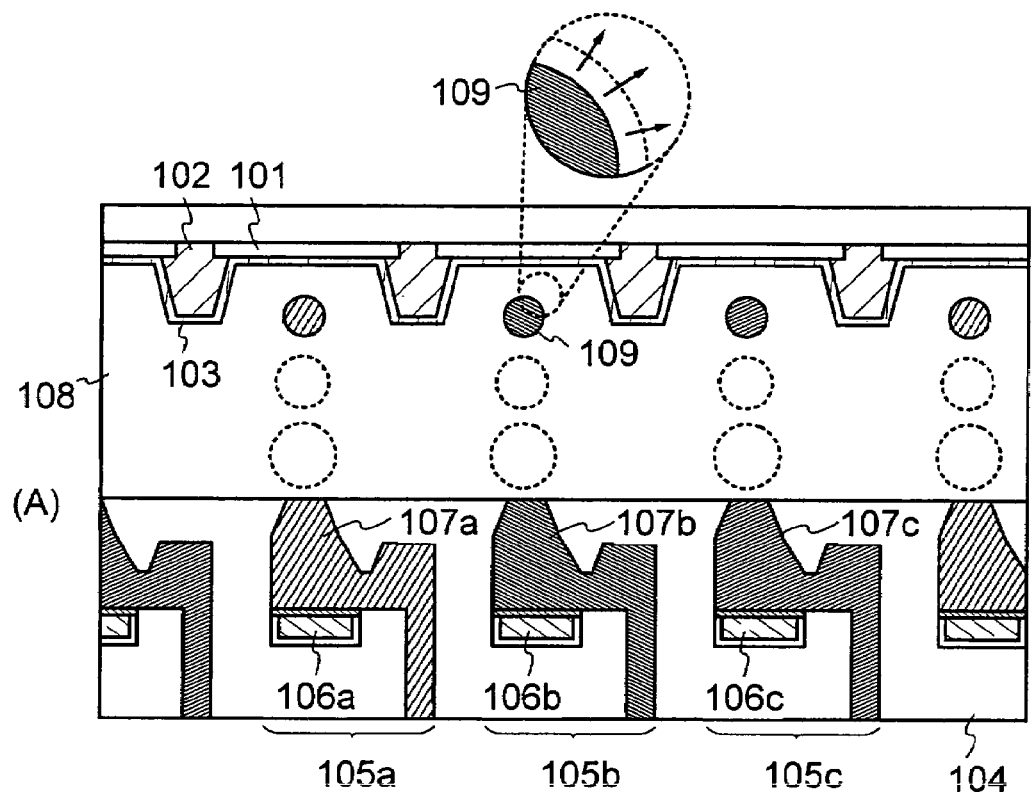
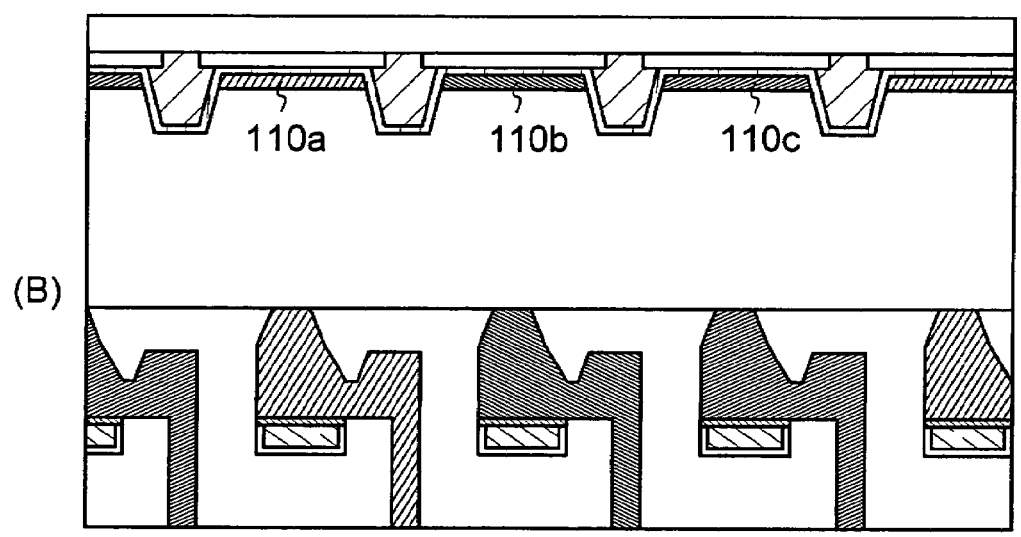

FIG. 3
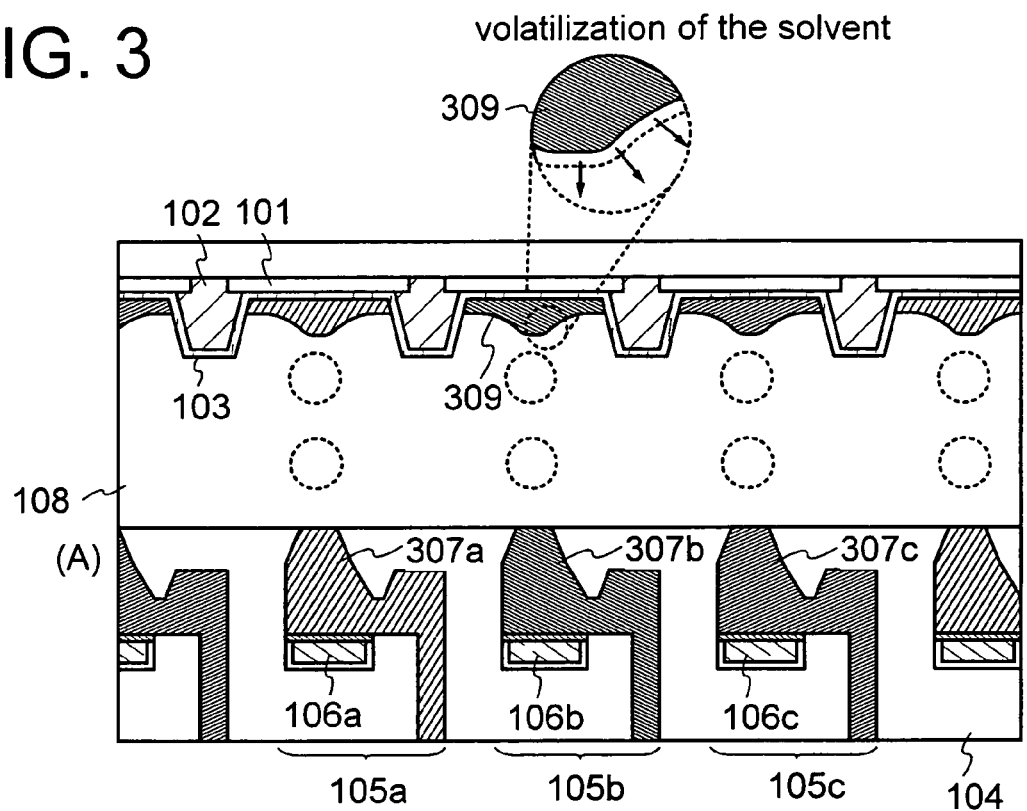
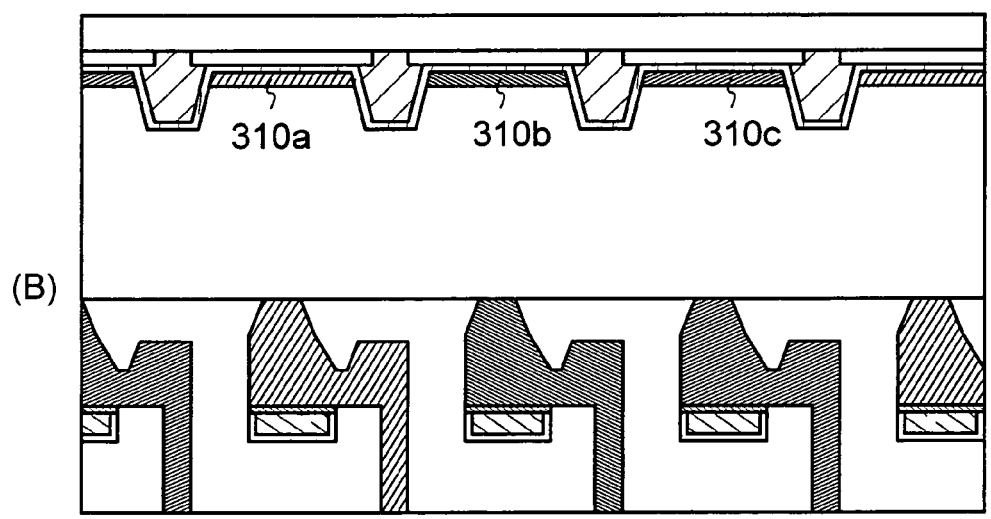

FIG. 13
(A)
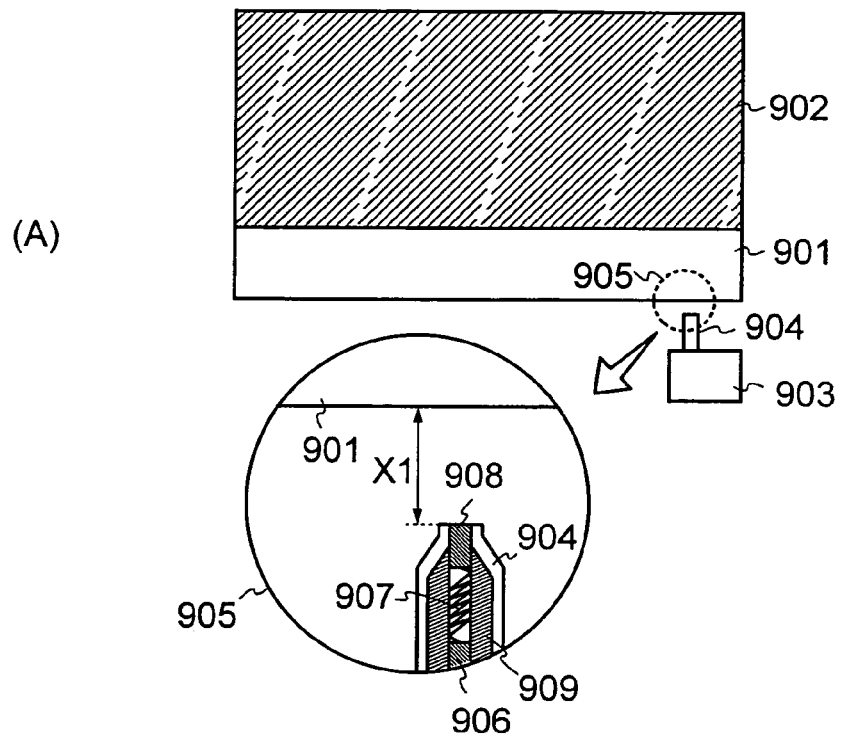
(B)
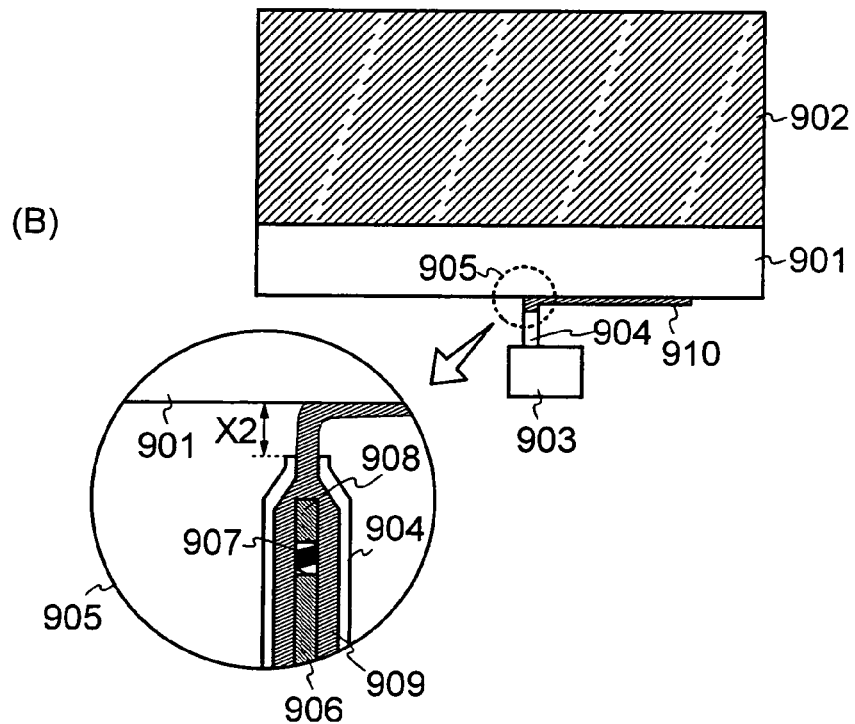

MANUFACTURING METHOD OF EMITTING DEVICE

TECHNICAL FIELD

The present invention belongs to a technical field related to a display device (hereinafter, described "light-emitting element") having, on a substrate, an element structured by an anode, a cathode and a thin film to cause a light-emitting by a phenomenon called electroluminescence (hereinafter, described "EL") sandwiched between the anode and the cathode, and to a technical field related to an electronics device having the light-emitting element in an image display portion.

BACKGROUND ART

A display for displaying an image is one of the light-emitting elements indispensable in modern living. The display for displaying an image takes a variety of forms matched to applications, ranging from so-called a television monitor to a liquid crystal display rapidly developed in recent years and an organic EL display expected for future development. Particularly, a liquid crystal display and an organic EL display are light-emitting elements to be driven on low voltage, which are the most important image displays from the viewpoint of energy saving.

Among them, an organic EL display draws the greatest attentions as a flat panel display element in the next generation.

In the emission mechanism of an organic EL display, a thin film (hereinafter, described "organic thin film") structured of a light-emitting body composition is provided between electrodes to flow current whereby the electrons injected from the cathode and the holes injected from the anode recombine at a luminescent center in a light-emitting body film and form a molecule exciton, to thereby utilize a photon released upon returning of the molecule exciton to the ground state.

Incidentally, the sort of the molecule exciton formed by the light-emitting body composition can be a singlet excitation state and a triplet excitation state. The present specification includes a case where any one of the excitation states contributes to light-emitting.

In such an organic EL display element (hereinafter, described "organic EL element"), an organic thin film is usually formed as a film as thin as below 1 μm. In addition, because a light-emitting body film itself is a self-light-emitting type element given out light, an organic EL element does not require a backlight as used on the conventional liquid-crystal display. Accordingly, it is a great merit that an organic EL element can be extremely fabricated thin and lightweight.

Moreover, for example in an organic thin film of nearly 100-200 nm, the time of from a carrier injection to a recombination reached is approximately several ten nanoseconds in the light of the carrier mobility in the light-emitting body composition film. Light-emitting is reached on the order of within a microsecond even if the course of from a carrier recombination to a light-emitting is included. Accordingly, very high-speed of response is also one of features.

Furthermore, because an organic EL element is a carrier-injection type light-emitting element, it can be driven on direct-current voltage, and hardly cause a noise. In addition, by forming a uniform ultra-thin organic thin film having nearly 100 nm in film thickness and using a suitable organic material, a driving is also possible on a voltage of several volts. Namely, an organic EL element, because of a self-light-emitting type and a wide in viewing angle, is well in visibility. Besides, an organic EL element also possesses the properties of thin and lightweight, high-speed responsibility, driving in direct-current and low voltage, and the like, and thus is expected as a light-emitting element in the next generation.

In order to fabricate such an organic EL element, there is an essential need of an art to form a thin film of a light-emitting body composition. In the liquid crystal display for example, in order to achieve a full-color display, there is a necessity to regularly form an organic thin film for functioning as a color filter on a glass substrate. On the other hand, in an organic EL element, a charge transport material for transporting the holes and electrons injected at an electrode and a luminescent material for light-emitting are a light-emitting body composition. These compounds must be formed with a filmy form between electrodes.

As techniques for forming such an organic thin film, various methods have been developed including a Langmuir-Blrogett method (LB method), a monomolecular film stack method, a dip coating method, a spin coat method, an inkjet method, a print method, a evaporation method, or the like. Among them, an inkjet method has particularly a merit that an organic material can be used with high-efficiency, a configuration of an apparatus is simple and can be reduced in size, and so on. Technically, it is already approximated to the practical application level. The basic technology concerning an inkjet method is disclosed in Patent Document 1, etc.

Patent document 1: Japanese Patent Laid-Open No. H10-12377

An inkjet method is an art that an inkjet system employed on the conventional printer is converted to a thin film forming, which is a method to apply droplets on a pixel to pixel basis by using, in place of ink, a solution or a dispersion liquid containing a light-emitting body composition as a material of an organic thin film. By volatilizing the solvent contained in the droplet, a thin film is formed on the individual pixel. By controlling the position of the droplet attached on a substrate, it is possible to form an arbitrary micropattern.

However, because the droplet deposited on the pixel (actually, pixel electrode provided in each pixel) contains a great amount of solvent component, there is a need of a process for volatilizing a solvent component (hereinafter, described "baking process") in order to remove a solvent component. Namely, after applying a droplet by an inkjet method, the pixel entirety is heated to volatilize a solvent component and thereby the remaining solute (material of an organic thin film) is formed with a thin film. Accordingly, in a case where the solvent of the solution containing a light-emitting body composition has a low vapor pressure, time is required in the baking process. Besides, a droplets attached on the neighboring pixels is ready to mix together, and the formation of a microscopic thin film pattern is hindered. In addition, when a solvent component is left in the thin film, the solvent volatilizes with time and a degasification phenomenon is caused. Therefore, a factor incurring a deterioration in the organic thin film and ultimately a deterioration as a light-emitting element is caused. Furthermore, if the heating temperature is raised to remove the solvent component completely, it results in destruction in the composition of an organic thin film having a low heat resistance.

In this manner, a formation method of the organic thin film based on ink jet method is advantageous in low cost and simple. However, a formation method of the organic thin film based on ink jet method has a problem in baking process, and thus is an art left room for improvement.

DISCLOSURE OF THE INVENTION

The present invention has been made in view of the above problem, and the present invention is an object to provide a technology for eliminating a baking process in an approach of forming an organic thin film by applying a solution. Furthermore, it is an object to provide a manufacturing method of a light-emitting device with high throughput in low cost and a simple method by applying the present art to manufacture a light-emitting device.

The present invention is a manufacturing method of a light-emitting device, characterized by spraying a solution containing a light-emitting body composition toward a pixel electrode (anode or cathode) under reduced pressure, specifically $1 \times 10^2$-$1 \times 10^5$ Pa, preferably 10-$2 \times 10^4$ Pa to deposit the light-emitting body composition on the pixel electrode, and thereby form a thin film having at least one layer. At this time, in duration before the solution arrives at the pixel electrode, the solvent in the solution may be volatilized and the remaining of the light-emitting body composition may be deposited on the pixel electrode, and thereby at least an organic thin film having at least one layer may be formed. Furthermore, by previously heating the pixel electrode (preferably at room temperature (typically 20° C.)-300° C., further preferably 50-200° C., considering the heat resistance of the light-emitting body composition), the solvent in the solution may be commenced to volatilize simultaneously with an arrival of the solution at the pixel electrode, to deposit the remaining of the light-emitting body composition on the pixel electrode, and thereby an organic thin film having at least one layer may be formed. In any event, the present invention is characterized in that solvent component is volatilized simultaneously with forming an organic thin film having at least one layer, and thereby the baking process required in the conventional process is eliminated or shorten.

In the present invention, a light-emitting body refers to a carrier injection material (hole injection material or electron injection material), a carrier transport material (hole transport material or electron transport material), a carrier blocking material (hole blocking material or electron blocking material), a luminescent material or another organic compound or inorganic compound contributing to carrier recombination, and a laminated body thereof. In addition, a light-emitting body composition refers to a composition usable as a material of those light-emitting bodies, irrespective of organic compound or inorganic compound. The light-emitting body composition roughly includes a luminescent material and a carrier (hole or electron) transport material.

The luminescent material is a material that causes an EL-based luminescent phenomenon by injecting holes or electrons. Such a luminescent material is found in an inorganic compound and an organic compound. The method of applying a solution like the present invention preferably uses an organic compound. In addition, the luminescent material may use a material to cause fluorescence based on singlet excitation or a material to cause phosphorescence based on triplet excitation. Moreover, the hole transport material is a material allowing the hole to readily move while the electron transport material is a material allowing the electron to readily move.

The pressure lower than the atmospheric pressure may be given as $1 \times 10^3$-$1 \times 10^5$ Pa in an atmosphere filled with an inert gas such as nitrogen or rare gas (hereinafter, referred to as inert atmosphere), and $1 \times 10^2$-$1 \times 10^5$ Pa under a reduced pressure. By being placed under a reduced pressure (also called in vacuum), the droplet ejected in the atmosphere always volatilizes the solvent from the droplet in the duration up to an arrival at the pixel electrode, thus the droplet volume is being reduced. At the time of an arrival at the pixel electrode, nearly all the part of the solvent vaporizes so as to complete film formation simultaneously with the arrival. Namely, there is excellence over the conventional art in that there is no need of a heating process, such as a baking process, after solution application.

In addition, in order to sufficiently volatilize the solvent before an arrival at the pixel electrode, it is preferred to use a highly volatile solvent (i.e. solvent high in vapor pressure) as a solvent. This is because, at low volatility, there is a need to increase the time required in volatilization by increasing the distance between the pixel electrode and an injection tip of the solution (nozzle tip), and when the distance is long, the trajectory error of a droplet is increased. Highly volatile solvents include alcohols such as methanol and ethanol.

In addition, in case where a solvent having a high melting point is used without using a solvent high in volatility, it is possible to eliminate the anxiety, e.g. clogging occurrence at the nozzle tip due to drying of droplets at the injection tip. In such a case, in case where the pixel electrode is previously heated (at a room temperature (typically 20° C.) to 300° C., further preferably 50 to 200 ° C., in consideration of heat resistance of the light-emitting body), volatilization begins together with an arrival of the droplet at the pixel electrode, and it is possible to complete a baking process simultaneously with ejection of a droplet to another pixel. Of course, by the above method, film quality can be further improved by volatilizing the solvent from the droplet in a duration up to an arrival of the droplet at the pixel electrode and further by previously heating the pixel electrode.

The above solvent high in melting point can use NMP (N-methyl pyrrolidone), DMF (dimethyl formamide), DMSO (dimethyl sulfoxide), HMPA (hexamethyl phosphoramide) or other polar solvents. In addition, the solvent low in polarity may use aromatic solvents like alkylbenzene (particularly, long-chain alkylbenzene like dodecylbenzene is preferred) such as xylene. For example, it is possible to use a solvent mixing tetralin and dodecylbenzene by 1:1.

Incidentally, the present invention can carry out in fabricating a passive matrix type light-emitting device and in fabricating an active-matrix type light-emitting device, and therefore the present invention is not especially limited to a light-emitting device mode. In addition, the luminescent material can be carried out on also an inorganic compound without limited to an organic compound. Moreover, the substrate to be processed can use paper, a polymer membrane, an inorganic oxide plate including glass, an indium-thin oxide (ITO) film, or the like without any limitation. Particularly, in the case of carrying out the present invention, there is no especially need of a baking process after solution application, and thereby the present invention is effective in laminating organic compounds.

BRIEF DESCRIPTION OF THE DRAWINGS

FIG. 1 is a sectional view of a solution-applying device used in carrying out the present invention.

FIG. 3 is a sectional view of a solution-applying device used in carrying out the present invention.

FIG. 13 is a sectional view of a solution-applying device to be used in carrying out the present invention.

BEST MODE FOR CARRYING OUT THE INVENTION

Embodiment Mode 1

Figure 2:
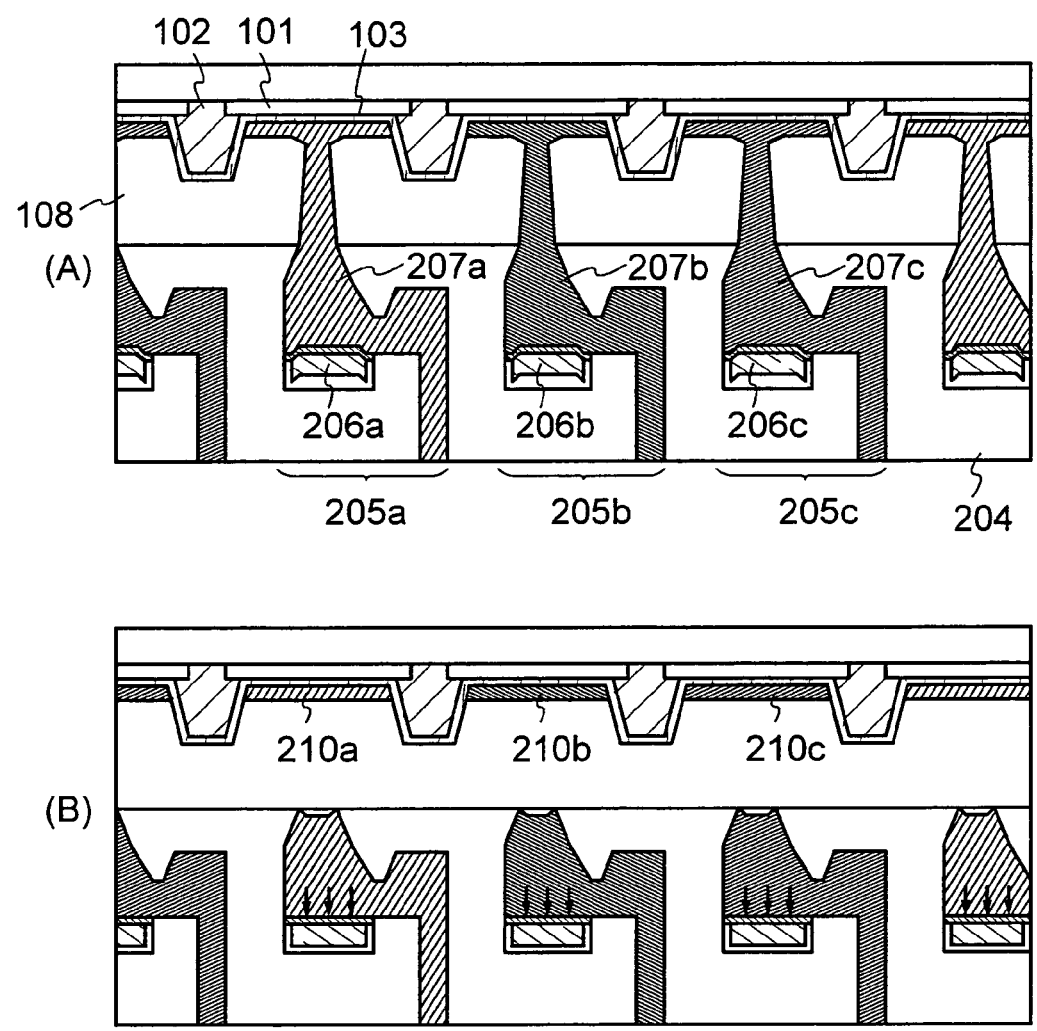
FIG. 2 is a sectional view of a solution-applying device used in carrying out the present invention.

An Embodiment Mode of the present invention is explained using FIG. 1. FIG. 1(A) represents a state immediately after ejecting a solution containing a luminescent material. FIG. 1(B) represents a state that the luminescent material has arrived at an anode or a cathode so as to form a thin film (light-emitting layer). Incidentally, the figure shows a manner that the substrate is provided parallel with respect to the horizontal plane and a light-emitting body is ejected from the below of the substrate.

In FIG. 1(A), 101 is an anode or a cathode, 102 is an insulator defining the each pixel, and 103 is a carrier injection layer. The carrier injection layer 103 is a hole injection layer provided that 101 is an anode, or an electron injection layer provided that 101 is a cathode. In addition, 104 is a magnification of a head in a device for applying a solution (hereinafter, referred to as a solution applying device), which partly shows an internal structure. The head 104 has a plurality of ejector parts 105a-105c having a function to eject a solution containing a luminescent material, which are respectively provided with piezoelectric elements (piezo elements) 106a-106c. Moreover, the ejector parts 105a-105c are respectively filled with solutions 107a-107c containing luminescent materials.

Here, the solution 107a containing a luminescent material includes a luminescent material to cause light-emitting in red, the solution 107b containing a luminescent material includes a luminescent material to cause light-emitting in green, and the solution 107c containing a luminescent material includes a luminescent material to cause light-emitting in blue. These three kinds of luminescent materials respectively constitute a pixel to cause light-emitting in red, a pixel to cause light-emitting in green and a pixel to cause light-emitting in blue. These three pixels are grasped as one pixel unit.

Incidentally, although FIG. 1(A) explains only one ejector part respectively corresponding to each of R (red), G (green) and B (blue), a plurality of ejector parts (nozzles) can be arranged in parallel. Taking throughput into consideration, it can be considered the most desirable to arrange those in the number corresponding to the number of pixels (pixel count) on one row or one column of a pixel portion.

In addition, the most characteristic point in the present invention lies in that a space 108 between the head 104 and the anode or the cathode 101 is sustained at a reduced pressure, i.e. at a pressure lower than the atmosphere pressure. Specifically, this is at $1 \times 10^3$-$1 \times 10^5$ Pa in inert atmosphere. The solution 107a-107c containing a luminescent material filled in the ejector part 105a-105c is pressurized and pushed out by alteration in volume of the piezoelectric element 106a-106c and ejected toward the pixel electrode 101. And, the ejected droplet 109 travels while volatilizing the solvent under the reduced pressure so that the remaining luminescent material is deposited on the pixel electrode 101. As a result, the luminescent material is deposited intermittently.

Thus, a thin film deposited is formed to a thin film in a state fully removed a solvent component without especially volatilizing the solvent by the means of heating or the like. Accordingly, it is possible to obtain a light-emitting layer reduced in problems such as deterioration with time due to degasification. By the structure as above, baking process or the like is not required even after applying the solution, and it is possible to greatly improve throughput and prevent the luminescent material itself from deteriorating due to heating. Incidentally, although the present invention is characterized in that baking process is not needed, if baking process such as heating process under a reduced pressure is used together, the effect of the present invention that a light-emitting layer is obtained that is fully removed a solvent component and reduced in degasification does not be spoiled.

In this manner, a light-emitting layer 110a for light-emitting in red, a light-emitting layer 110b for light-emitting in green, and a light-emitting layer 110c for light-emitting in blue are formed, as shown in FIG. 1(B). Thereafter, when a counter electrode (a cathode for an anode, an anode for a cathode) is provided after forming a carrier transport layer, a carrier injection layer and the like, if necessary, and then a light-emitting element is completed.

Embodiment Mode 2

The present Embodiment Mode is an example to apply a gel solution having a certain degree of viscosity instead of applying a solution by ejecting droplets. FIG. 2(A) represents a state that a solution containing a luminescent material is being ejected while FIG. 2(B) represents a state that the solution containing a luminescent material is ceased from ejecting. Incidentally, this figure shows a manner that the substrate is provided parallel with respect to the horizontal plane and a light-emitting body is being ejected from the below of the substrate. In addition, the same references as those used in FIG. I may be referred to the explanation of Embodiment Mode 1.

The present Embodiment Mode has a plurality of ejector parts 205a-205c respectively having functions to eject luminescent materials, in a head 204 of a solution applying device as shown in FIG. 2(A), and the respective ones 205a-205c are provided with piezoelectric elements (piezo elements) 206a-206c. In addition, the ejector parts 205a-205c are respectively filled with solutions 207a-207c containing luminescent materials. At this time, similarly to FIG. 1(A), the solution 207a containing a luminescent material includes a luminescent material to cause light-emitting in red, the solution 207b containing a luminescent material includes a luminescent material to cause light-emitting in green, and the solution 207c containing a luminescent material includes a luminescent material to cause light-emitting in blue.

However, in the present Embodiment Mode, the viscosity of the solution 207a-207c containing a luminescent material is adjusted higher than the viscosity of the solution 107a-107c containing a luminescent material of Embodiment Mode 1. This is to apply the solution containing a luminescent material continuously. As a result, the luminescent material is deposited continuously. In addition, as shown in FIG. 2(A), when applying the solution 207a-207c containing a luminescent material, the solution 207a-207c containing a luminescent material is pressurized and applied in a manner being pushed out by an inert gas such as nitrogen in a state where the piezoelectric element 206a-206c is pushed down.

Incidentally, the solution 207a-207c containing a luminescent material begins to volatilize the solvent immediately after coming out of the injection tip so as to reach onto a pixel electrode 101 while being gradually reduced in volume. By the time the solution reached onto the pixel electrode 101, the solvent in the major part is volatilized and the remaining luminescent material is deposited to form a light-emitting layer. Of course, the atmosphere within the space 108 is sustained at a reduced pressure similar to Embodiment Mode 1.

In addition, as shown in FIG. 2(B), when the application of the solution 207a-207c containing a luminescent material ceases, the pressurization by the inert gas is stopped and the piezoelectric element 206a-206c is put in a state pushed up (in the direction of an arrow). By doing so, the solution containing a luminescent material is retracted to somewhat deep from the injection tip, and thereby it is possible to prevent the solution from drying.

Furthermore, at this time, by placing the space 108 with a solvent atmosphere, the solution 207a-207c containing a luminescent material can be prevented from drying at the injection tip. In addition, although the present Embodiment Mode showed the example that the solution is introduced into the injection tip by the use of the piezoelectric element 206a-206c, this can be similarly made by putting the space 108 in a pressurized state.

In this manner, a light-emitting layer 210a for light-emitting in red, a light-emitting layer 210b for light-emitting in green and a light-emitting layer 210c for light-emitting in blue are formed, as shown in FIG. 2(B). Thus, because the light-emitting layer formed becomes a thin film in a state fully removed a solvent component without especially volatilizing the solvent by the means of heating or the like, it is possible to obtain a light-emitting layer reduced in the problem of deterioration with time due to degasification. Even after applying the solvent by the above structure, there is no need for a baking process and the like, and it is possible to greatly improve throughput and to prevent the luminescent material itself from deteriorating due to heating.

Incidentally, although the present invention is characterized in that a baking process is not required, if the baking process such as a heating process under a reduced pressure is used together, the effect of the present invention that a light-emitting layer is obtained that is fully removed solvent component and reduced in degasification does not be spoiled. In addition, thereafter, when a counter electrode (a cathode for an anode, an anode for a cathode) is provided after forming a carrier transport layer, a carrier injection layer and the like, if necessary, and then a light-emitting element is completed.

In addition, the present invention can be carried out in manufacturing a passive-matrix type light-emitting device and in manufacturing an active-matrix type light-emitting device, and thus the present invention is not limited to the form of a light-emitting device. Moreover, the luminescent material can be practiced concerning an inorganic compound not limited to an organic compound. Particularly, when the present invention is carried out, a case where organic compounds are laminated is effective because baking process is not especially required after applying a solution.

Embodiment Mode 3

The present Embodiment Mode is explained by using FIG. 3. FIG. 3(A) represents a state that a solution containing a luminescent material is ejected, and the droplet thereof is arrived at an anode or a cathode hereupon. FIG. 3(B) represents a state that a luminescent material is baked over the anode or a cathode to thereby form a thin film (light-emitting layer). This figure shows a manner that the substrate is provided parallel with respect to the horizontal plane wherein a light-emitting body is by ejection from the below of the substrate. Incidentally, the solution-applying device in FIG. 3 is the same as that explained in FIG. 1. The parts having the same references as those used in FIG. 1 may be referred to the explanation in Embodiment Mode 1.

In FIG. 3(A), the ejector parts 105a-105c having piezoelectric elements (piezo elements) 106a-106c are respectively filled with solutions 307a-307c containing luminescent materials. The solution 307a-307c containing a luminescent material uses, as a solute, a luminescent material for light-emitting in red, green or blue, and, as a solvent, a solvent having a high boiling point (note, preferably to volatilize at room temperature (typically 20° C.) to 300° C., more preferably at 50 to 200° C.). For this reason, the solution 307a-307c containing a luminescent material is a solution considerably not to readily dry.

The solutions 307a-307c containing luminescent materials are pushed out by the piezoelectric elements 106a-106c and ejected through a plurality of ejector parts 105a-105c. The liquid deposit in a state immediately after arrival on the anode or the cathode 101 is denoted at 309. Of course, the space 108 between the head 104 and the anode or the cathode 101 is sustained at a reduced pressure, i.e. at a pressure lower than the atmosphere pressure. Specifically, it is at $1 \times 10^3$-$1 \times 10^5$ Pa in inert atmosphere.

At this time, the anode or the cathode 101 is heated at a room temperature (typically 20° C.) to 300° C., further preferably 50 to 200° C. The liquid deposit 309 immediately after arrival on the anode or the cathode 101 begins to volatilize the solvent at a time of arrival. Incidentally, FIG. 3(A) explains only the pixels of one line. However, the actual pixel region is arranged with a plurality of lines of pixels in juxtaposition so that the solutions 307a-307c containing luminescent materials are ejected onto the pixels in sequence. Accordingly, a constant time is required in the application throughout the entire pixels. The present Embodiment Mode is introduced to complete a baking process by making use of such a constant time.

The thin film thus deposited is nearly completed in a baking process at the time the application is ended over the entire pixel region. Despite carrying out a baking process, process time can be greatly shortened as compared to the conventional approach. In this manner, a light-emitting layer 310a for light-emitting in red, a light-emitting layer 310b for light-emitting in green, and a light-emitting layer 310c for light-emitting in blue are formed, as shown in FIG. 3(B). In addition, thereafter, when a counter electrode (a cathode for an anode, an anode for a cathode) is provided after forming a carrier transport layer, a carrier injection layer and the like, if necessary, and then a light-emitting element is completed.

Incidentally, the structure of this Embodiment Mode that the entire pixel region to turn into a region to be formed is heated up during applying a solution by an inkjet scheme by the use of a solution containing a luminescent material using a solvent high in boiling point, even if applied to the solution applying device of the structure of not only Embodiment Mode 1 but also in Embodiment Mode 2, can obtain the same effect as the present Embodiment Mode.

Embodiment Mode 4

The present Embodiment Mode explains an art for filling a light-emitting body composition without exposure to the air during filling a solution containing a light-emitting body composition to the head shown in Embodiment Mode 1 and Embodiment Mode 2.

Figure 4:
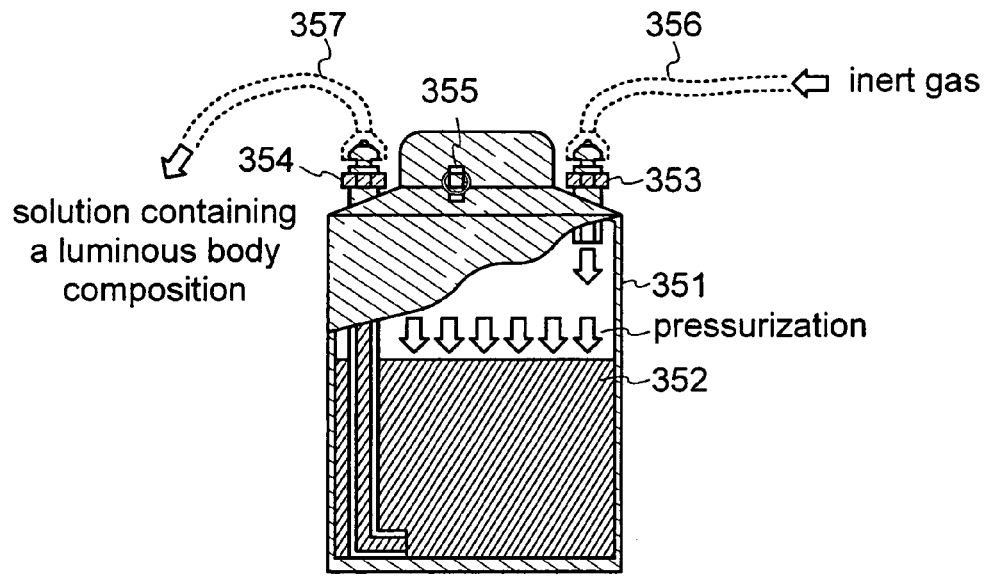
FIG. 4 is a sectional view of a vessel for reserving a solution containing a light-emitting body composition, in the solution-applying device used in carrying out the present invention.

FIG. 4 shows a sectional view of a vessel (canister can) for reserving (stocking) a solution containing a light-emitting body composition in a solution-applying device. A vessel 351 is desirably formed of a material having a sufficient resistance to secrecy, particularly, transmission of oxygen or moisture. It preferably uses stainless steel, aluminum or the like. In addition, the inner surface is desirably mirror finished. Furthermore, the inner surface and/or the outer surface may be provided, as required, with an insulation film low in oxygen transmittance of a silicon nitride film, diamond-like carbon film or the like. This is for preventing against deterioration of a solution 352 containing a light-emitting body composition provided within the vessel 351.

In addition, 353 is an introduction port for introducing an inert gas of nitrogen, a rare gas or the like into the vessel 351, through which an inert gas is introduced to pressurize the in-vessel pressure. In addition, 354 is an exit port to feed the solution 352 containing a light-emitting body composition delivered by pressurization to the head of the solution-applying device (not shown). The introduction port 353 and the exit port 354 may be formed of a different material from the vessel 351 or integrally formed therewith.

Incidentally, 356 is a introduction tube for coupling to the introduction port 353. When actually introducing an inert gas, the tip of the introduction tube 356 is connected to the in introduction port 353 to thereby introduce the inert gas. Similarly, the tip of the exit tube 357 is coupled to the exit port 354, to allow the solution 352 containing a light-emitting body composition to exit. In the figure, they are removable and hence shown by the dotted lines.

Each head shown in Embodiment Mode 1 and Embodiment Mode 2 is attached at an extended tip of the exit tube 357. In the case of Embodiment Mode 1, by vibrating the piezoelectric element 106a-106c in a state the vessel 351 at its inside is pressurized by the inert gas, the solution 352 containing a light-emitting body composition can be ejected intermittently. In addition, in the case of Embodiment Mode 2, continuous application is possible during pressurization by the inert gas within the vessel 351. When pressurization is ceased, the solution 352 containing a light-emitting body composition is stopped from ejecting.

Furthermore, the present Embodiment Mode is characterized in that, in the duration of from placing the solution 352 containing a light-emitting body composition into the vessel 351 up to an attachment to the solution-applying device, transport is always in a state shielded from the air. Namely, the maker as a manufacturer of the solution 352 containing a light-emitting body composition is permitted to place a solution 352 containing a light-emitting body composition into the vessel 351, transport it while keeping air-tightness without release to the air, and attach it directly onto the solution applying device. This is a devising made in view of the fact that the light-emitting body composition is low in resistance to oxygen or moisture and ready to deteriorate. Because of the capability of keeping the purity of refinement as it is in the duration of after refining the light-emitting body composition and before application, it contributes to suppression against deterioration in the light-emitting body composition and ultimately to improvement in the reliability of the light-emitting device.

Incidentally, the vessel shown in FIG. 4 in the present Embodiment Mode is a suitable one example for transporting a solution containing a light-emitting body composition while keeping the purity thereof, which is not limit the vessels which can be used for the present invention.

Embodiment Mode 5

Figure 5:
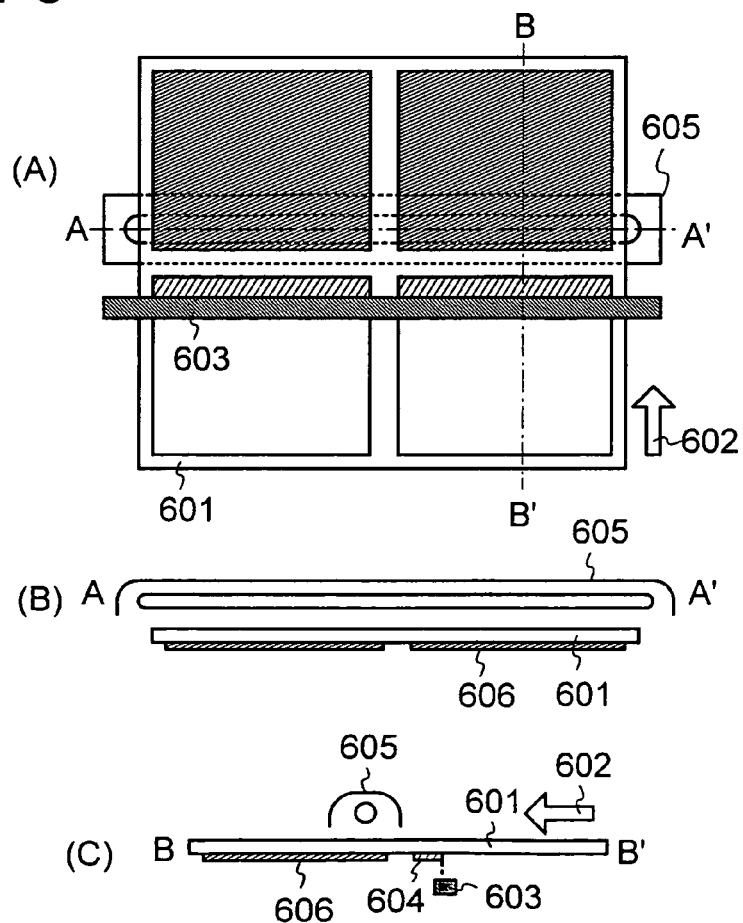
FIG. 5 is a view showing a manufacturing method of a light-emitting device of the present invention.

The present Embodiment Mode is characterized in that a longer wavelength region of light is used upon heating the pixel region entirety in Embodiment Mode 3. The structure of the present embodiment is explained using FIGS. 5(A)-(C). Incidentally, FIG. 5(A) is a view of the substrate as viewed from the below when the substrate is heated up in the present Embodiment Mode. FIG. 5(B) is a sectional view along A-A' therein, and FIG. 5(C) is a sectional view along B-B' therein.

In FIG. 5(A), 601 is a substrate which transmits at least a longer wavelength of light (typically, a longer wavelength of light than a wavelength 300 nm) than a visible portion of light on which thin film transistors, pixel electrodes and the like are provided. The substrate 601 is transported in a direction of an arrow 602 by a transport mechanism not shown.

In addition, a head 603 of a solution-applying device is provided underneath a surface to be processed of the substrate 601, to apply a solution containing a light-emitting body composition in the form explained in Embodiment Mode 1-3. A light-emitting body composition 604 applied is heated by the light (hereinafter, referred to as lamp light) emitted from a lamp 605 set up above a backside of the substrate 601, and made into a light-emitting body 606 by volatilization of solvent (being baked). Namely, the applied light-emitting body composition 604, after application, is baked sequentially by lamp light and made into a thin film.

Namely, by moving the substrate 601, the head 603 and the lamp 605 is relatively scanned in a direction reverse to the moving direction of the substrate 601. Of course, the substrate 601 can be fixed to scan the head 603 and the lamp 605. In this case, the head 603 is structurally earlier to be scanned at all times. As a result, effected nearly simultaneously are solution application by the head 603 and the subsequent baking process base on lamp light, and then it can obtain an effect equal to substantially curtail the baking process.

Incidentally, the light can be used as lamp light is a wavelength of light capable of heating only without destructing the composition of the light-emitting body 606. Specifically, it is preferably a longer wavelength of light than 400 nm, i.e. a longer wavelength of light than infrared light. For example, it can use an electromagnetic wave in a wavelength region of 1 μm-10 cm from a far-infrared ray to a microwave. Particularly, a far-infrared ray (typically a wavelength of 4-25 μm) is preferably used in respect of handling.

In addition, although the example was herein shown that entire-surface application is completed simply by once scanning of the head 603, the substrate 601 may be reciprocated several times to perform repeated applications a plurality of number of times, and then the scanning of the lamp 605 may be performed. At this time, the lamp 605 may be put off during the scanning of the head 603 in first few times. In synchronism with the last scanning of the head 603, scanning and light-emitting may be made with the lamp 605.

As above, by irradiating a longer wavelength than far-infrared region of light by the use of a light source such as a lamp as heating means in a baking process, application and baking of a light-emitting body composition can be carried out nearly simultaneously. This can provide a process substantially omitted a baking process. This can improve the throughput in a manufacture process of a light-emitting device.

Embodiment Mode 6

Figure 6:
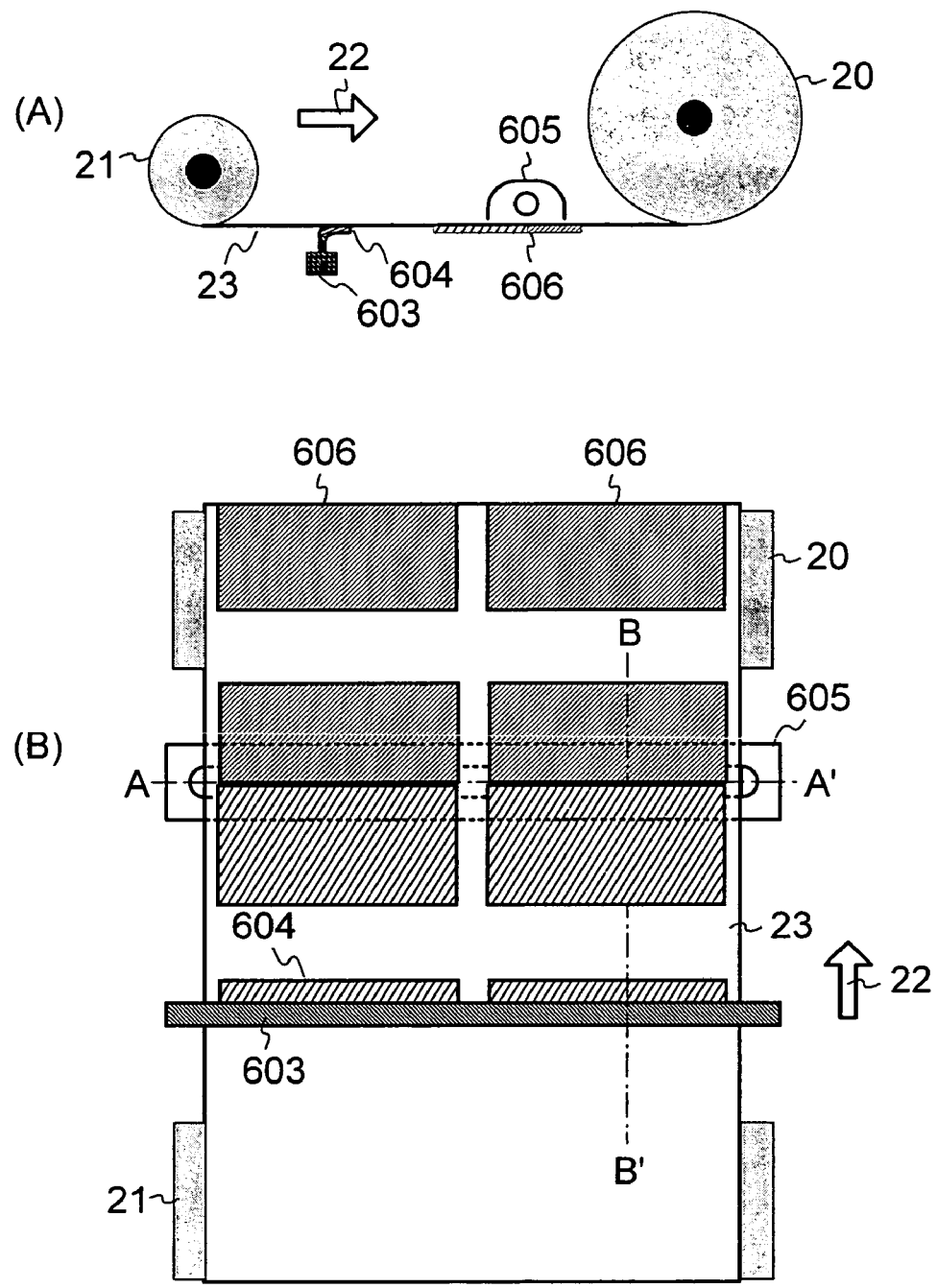
FIG. 6 is a view showing a manufacturing method of a light-emitting device of the present invention.

The present Embodiment Mode is characterized in that a Roll-to-Roll scheme is employed in Embodiment Mode 5. Namely, as shown in FIG. 6(A), a flexible substrate such as a polymer film is previously formed in a strip form and taken up in a cylindrical form. In FIG. 6(A), thin film transistors, pixel electrodes and the like are previously provided on a take-up flexible substrate 21. The substrate 21 is led out in a direction of an arrow 22 from a tip and again taken up to a cylindrical core, and thus a substrate 20 is formed. FIG. 6(B) is a view of the present device as viewed from the below. The substrate 21 taken up is led out in the direction of the arrow 22 and again taken up to form a roll-formed substrate 20.

By leading out the substrate 21 from the tip, the substrate is exposed. The head 603 of a solution-applying device is set up below an exposed portion 23, to apply a solution containing a light-emitting body composition in the form explained in Embodiment Mode 1-3. Incidentally, a plurality of the head of the solution-applying device can be provided. The applied light-emitting body composition 604 is heated by the lamp light from the lamp 605 set up above the exposed portion 23 of the substrate, and volatilized a solvent (baked) and made into a light-emitting body 606. As a result, nearly simultaneously effected can be solution application by the head 603 and the subsequent baking process base on lamp light.

In addition, because it is possible to apply a solution containing a light-emitting body composition nearly continuously, it is easy to prevent the nozzle from drying. Furthermore, because the substrate can be provided in a state taken up in a roll form, solution application and baking process can be achieved nearly simultaneously, and therefore the exposed portion 23 of the substrate can be decreased in area. Because the substrate completed of baking can be immediately taken up into a roll form, the throughput of the light-emitting device in a manufacture process can be improved. Besides, size reduction and space saving of the light-emitting device can be achieved at the same time.

Embodiment Mode 7

The light-emitting body shown in Embodiment Mode 1-5 includes a light-emitting layer, a hole injection layer, a hole transport layer, a hole blocking layer, an electron injection layer, and an electron transport layer or an electron blocking layer or a lamination thereof. These may be structured by only organic compounds or by a composite laminated with organic and inorganic compounds.

Accordingly, the present Embodiment Mode explains an example using a composite that organic and inorganic compounds are conjugated as a light-emitting body for a light-emitting device of the present invention. Incidentally, there is U.S. Pat. No. 5,895,932 as a patent characterized in a hybrid structure laminated with organic and inorganic compounds. This patent is an art that the ultraviolet light (wavelength 380 nm) emitted from a diode formed of an inorganic compound is irradiated to $Alq_3$ (tris-8-quinolinolato aluminum complex) as an organic compound and thereby to extract the light caused by a phenomenon called photoluminescence. This is a technical idea basically different from the light-emitting body explained in the present Embodiment Mode, i.e. composite.

Among organic compounds, polymeric organic compounds (hereinafter, referred to as organic polymers) are high in heat resistance and easy to handle, and hence used as solutes in the film forming methods with solution application. The present Embodiment Mode explains a case using a composite of an organic polymer and an inorganic compound as a light-emitting body.

The examples of forming a light-emitting body by laminating an organic polymer and an inorganic compound typically include the following four patterns:

(a) combination of a hole injection layer (or hole transport layer) of an inorganic compound and a light-emitting layer of an organic polymer, (b) combination of an electron injection layer (or electron transport layer) of an inorganic compound and a light-emitting layer of an organic polymer, (c) combination of a light-emitting layer of an inorganic compound and a hole injection layer (or hole transport layer) of an organic polymer, and (d) combination of a light-emitting layer of an inorganic compound and an electron injection layer (or electron transport layer) of an organic polymer.

In addition, the examples of forming a light-emitting body by mixing an organic polymer and an inorganic compound typically include the following three patterns:

(e) an organic polymer having a carrier transportability is provided as a light-emitting layer, and combination mixed with an inorganic compound in the organic polymer, (f) combination mixed, as a light-emitting layer, with an organic polymer and inorganic compound having the same conductivity (n-type or p-type) of carrier transportability, and (g) combination of an organic polymer having a carrier transportability mixed with an inorganic compound having a carrier acceptability.

The above structure (g) includes a combination, for example, of an organic polymer having a hole transportability mixed with an inorganic compound having an electron acceptability. In this case, the inorganic compound having an electron acceptability is in a structure that the inorganic compound receives electrons from the organic polymer and, as a result, holes occur in the organic polymer and furthermore the holes are transported to obtain transportability.

In the above structures (a)-(g), the hole injection layer or the hole transport layer formed of an inorganic compound can use a p-type semiconductor material such as NiO (nickel oxide). The electron injection layer or the electron transport layer formed of an inorganic compound can use an n-type semiconductor material such as ZnO (zinc oxide) or $TiO_2$ (titanium dioxide). The light-emitting layer formed of an inorganic compound can use such as ZnS (zinc sulfide) or CdS (cadmium sulfide).

For example, the example of the above structure (b) includes an example using PPV (polyparaphenylene vinylene) as an organic polymer and CdS as an inorganic compound, and manufacturing these by solution application. In this case, in forming CdS, a nano-fine particle (refer to a particle of several nm to several tens nm, ditto in the hereinafter) of CdS can be dispersed in a solvent and applied. The application process of the present invention may be carried out to this application process. Incidentally, in place of Cds, may be used an n-type semiconductor material of ZnO, $TiO_2$ or the like or a p-type semiconductor material of NiO or the like. In addition, a conjugated polymer such as a polyacetylene derivative, a polythiophene derivative, a polyphenylene ethynylene derivative, a polyvinyl carbazole derivative, a polyfluorene derivative and a polysilanes may be used as the organic polymer.

The example of the above structure (e) includes an example using PVK (polyvinyl carbazole) as an organic polymer and CdS as an inorganic compound and manufacturing these by solution application. In this case, light-emitting takes place on CdS as a luminescent center. In forming CdS, a CdS particle can be dispersed in a solvent and applied. The application process of the present invention may be carried out to this application process. Incidentally, in place of Cds, an inorganic compound such as ZnS can be used. These CdS and ZnS, because of inorganic compounds easy to make a nano-fine particle, are quite suitable materials where solution application is premised as in the present invention.

In addition, the example of the above structure (g) uses PC (polycarbonate) as an organic polymer, and the PC is mixed with TPD (triphenyl diamine) as a hole transportable inorganic compound and alkoxide of Ti to perform solution application, and then to form a light-emitting body mixed with PC, TPD and $TiO_2$ by hydrolysis and heating under a reduced pressure. In this case, in forming CdS, a CdS particle can be dispersed in a solvent and applied. The application process of the present invention may be carried out to this application process.

As above, a composite light-emitting body (composite) can be fabricated by the use of various organic and inorganic compounds. In addition, in the formation thereof, the fabrication method of the present invention can be carried out.

Incidentally, the structure of a light-emitting body (composite) shown in the present Embodiment Mode can be fabricated in any of the methods in Embodiment Modes 1-3 and 5. Preservation is also possible in the vessel shown in Embodiment Mode 4.

Embodiment Mode 8

Figure 7:
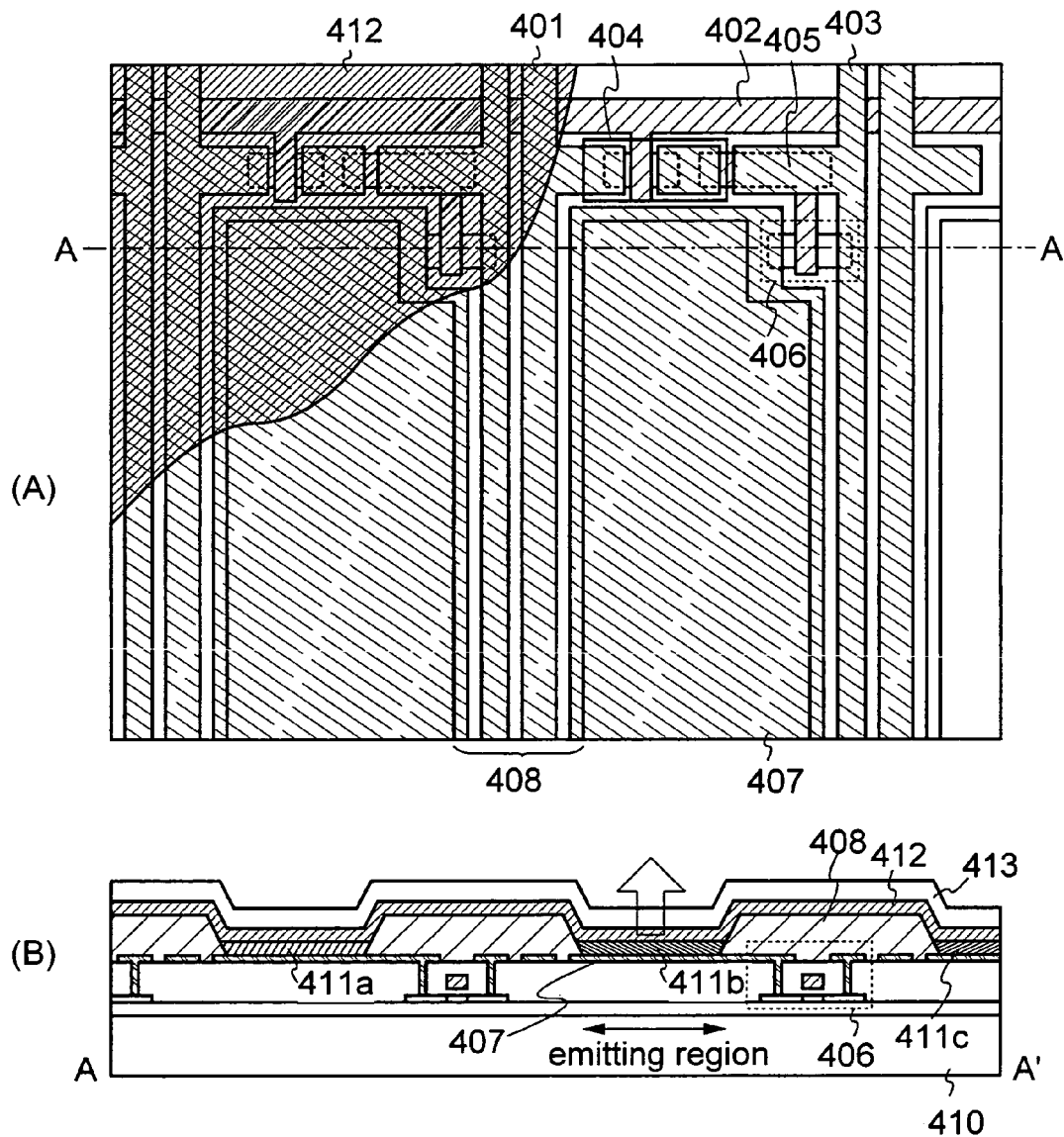
FIG. 7 is a top view and a sectional view showing a pixel structure of a light-emitting device by carrying out the present invention.

The present Embodiment Mode explains one example of a light-emitting device that can be fabricated by carrying out the present invention, with using FIG. 7. In a pixel structure shown in FIG. 7(A), 401 is a data signal line, 402 is a gate signal line, 403 is a power source line, 404 is a switching thin film transistor (referred to as a switching TFT, ditto in the hereinafter), 405 is a capacitor for holding charge, 406 is a driving thin film transistor (referred to as a driving TFT, ditto in the hereinafter) for supplying current to the light-emitting device, 407 is a pixel electrode connected to a drain of the driving TFT, and the pixel electrode 407 functions as an anode of the light-emitting device. In addition, 412 is a counter electrode. The counter electrode 412 functions as a cathode of a light-emitting device.

FIG. 7(B) shows a figure corresponding to a sectional plane on A-A' at this time. In FIG. 7(B), 410 is a substrate that can use a transparent substrate of a glass substrate, a quartz substrate, a plastic substrate or the like. The driving TFT 406 is formed on the substrate 410 by the use of a semiconductor process. In addition, an insulator 408 patterned in a grating form is provided in a manner covering an end of the pixel electrode 407 formed so as to be connected to the driving TFT 406 and at least the driving TFT and a switching TFT.

On these pixel electrodes 407, provided are light-emitting bodies 411a-411c, a counter electrode 412 functioning as a cathode and a passivation film 413. The light-emitting bodies 411a-411c refers to an organic compound, inorganic compound or a lamination thereof, which contributes to carrier recombination in a carrier injection layer, a carrier transport layer, a carrier blocking layer, a light-emitting layer and the like. The lamination structure and material of the light-emitting bodies 411a-411c may use a known structure and material.

For example, the light-emitting body as its at least one layer may include an inorganic hole injection layer (or may be referred to as an inorganic hole transport layer) high in resistance (resistivity: $1-1\times10^{11}\Omega\cdot cm$) as described in Japanese Patent Laid-open No. 2000-268967, Japanese Patent Laid-open No. 2000-294375, etc. The inorganic hole injection layer contains, as a first component, an alkali metal element selected from Li, Na, K, Rb, Cs and Fr, an alkali earth metal element selected from Mg, Ca and Sr or a lanthanide-based element selected from La and Ce, and as a second component, an element selected from Zn, Sn, V, Ru, Sm and In. In addition, the light-emitting body as its at least one layer may include an inorganic electron transport layer high in resistance (resistivity: $1-1\times10^{11}\Omega\cdot cm$). The inorganic hole injection layer contains a metal element selected from Au, Cu, Fe, Ni, Ru, Sn, Cr, Ir, Nb, Pt, W, Mo, Ta, Pd and Co, or an oxide, an carbide, a nitride, a silicide or a boride thereof. In addition, the inorganic hole injection layer may be based on an oxide of silicon, germanium or silicon germanium. By using a stable inorganic insulation film in a part of the light-emitting body, reliability can be enhanced as a light-emitting device.

In addition, the counter electrode 412 can use an aluminum film or silver thin film containing an element belonging to group 1 or 2 of the periodic table. However, in the case of the present Embodiment Mode, because of the necessity to transmit the light emitted from the light-emitting body 411a-411c, the film thickness is desirably given at 50 nm or less. Moreover, the passivation film 413 can use an insulation film exhibiting high blockability against moisture and oxygen, such as a silicon nitride film, an aluminum nitride film, a diamond-like carbon film or the like.

In fabricating a light-emitting device of the above structure, implementing the present invention makes it possible to produce a light-emitting device high in throughput by a low cost and a simple method. Furthermore, the reliability of the light-emitting device can be also improved.

Embodiment Mode 9

Figure 8:
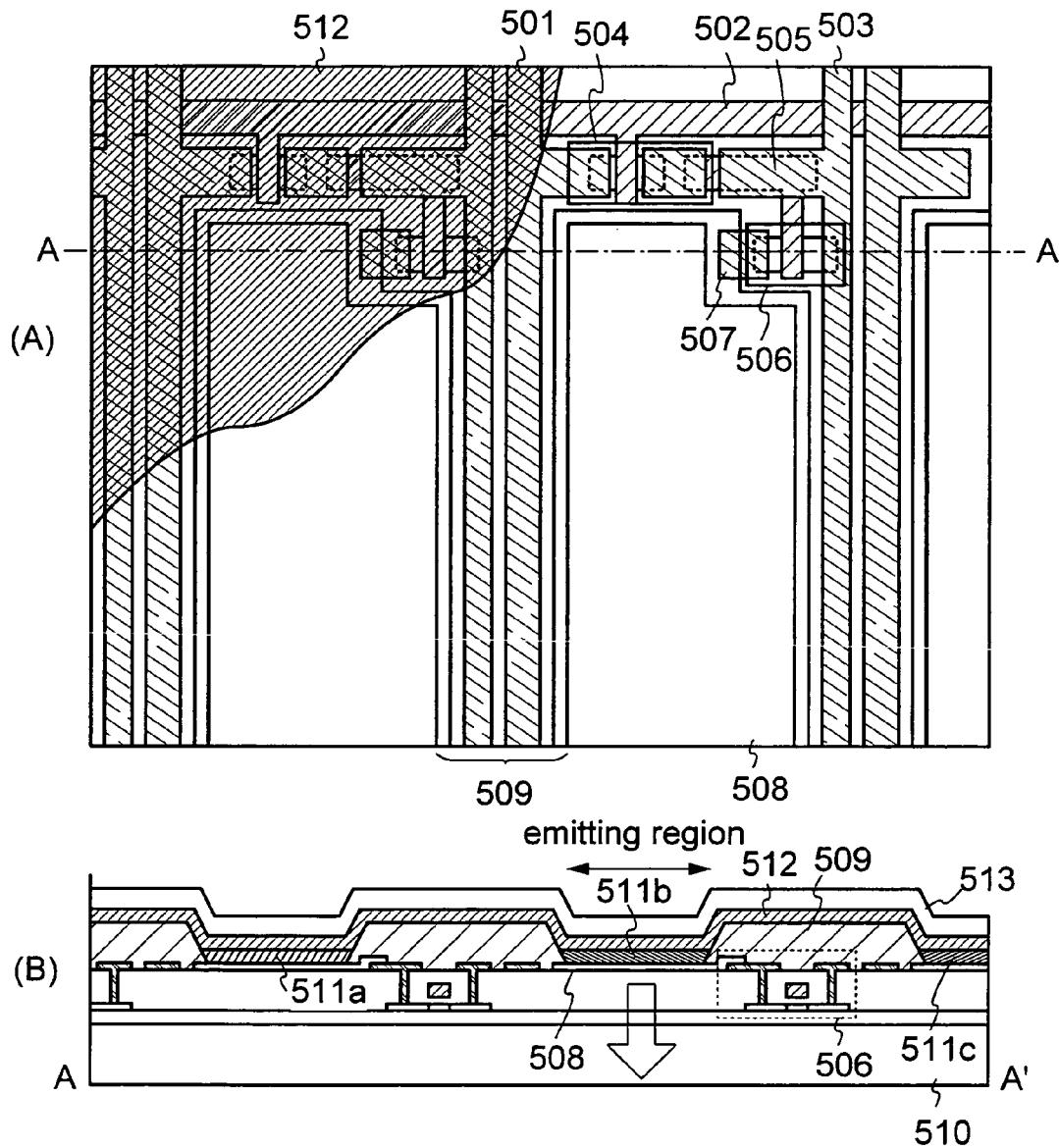
FIG. 8 is a top view and a sectional view showing a pixel structure of a light-emitting device by carrying out the present invention.

The present Embodiment Mode explains one example of a light-emitting device that can be fabricated by carrying out the present invention, with using FIG. 8. In a pixel structure shown in FIG. 8(A), 501 is a data signal line, 502 is a gate signal line, 503 is a power source line, 504 is a switching TFT, 505 is a capacitor for holding charge, 506 is a driving TFT, 507 is a drain electrode of the driving TFT, and 508 is a pixel electrode connected to the drain of the driving TFT, and the pixel electrode 508 functions as an anode of the light-emitting device. This pixel electrode 508 preferably uses a conductor film transparent for a visible portion of light so that the light emitted from the light-emitting body can transmit. It preferably uses an oxide conductor film such as ITO (compound of indium oxide and thin oxide) or a compound of indium oxide and zinc oxide. 512 is a counter electrode. The counter electrode 512 functions as a cathode of the light-emitting device.

FIG. 8(B) is a figure corresponding to a sectional plane on A-A' at this time. In FIG. 8(B), 510 is a substrate that can use a transparent substrate of a glass substrate, a quartz substrate, a plastic substrate or the like. The driving TFT 506 is formed on the substrate 510 by the use of a semiconductor process. In addition, an insulator 509 patterned in a grating form is provided in a manner covering an end of the pixel electrode 508 formed so as to be connected to the driving TFT 506 and at least the driving TFT and a switching TFT.

On these pixel electrodes 508, provided are light-emitting bodies 511a-511c, a counter electrode 512 to function as a cathode and a passivation film 513. The light-emitting bodies 511a-511c refer to an organic compound, inorganic compound or a lamination thereof, which contributes to carrier recombination in a carrier injection layer, a carrier transport layer, a carrier blocking layer, a light-emitting layer and the like. The lamination structure and material of the light-emitting bodies 511a-511c may use a known structure and material.

For example, the light-emitting body as its at least one layer may include an inorganic hole injection layer (or may be referred to as inorganic hole transport layer) high in resistance (resistivity: $1-1\times10^{11}\Omega\cdot cm$) as described in Japanese Patent Laid-open No. 2000-268967 and Japanese Patent Laid-open No. 2000-294375, etc. The inorganic hole injection layer contains, as a first component, an alkali metal element selected from Li, Na, K, Rb, Cs and Fr, an alkali earth metal element selected from Mg, Ca and Sr or a lanthanide-based element selected from La and Ce, and as a second component, an element selected from Zn, Sn, V, Ru, Sm and In. In addition, the light-emitting body as its at least one layer may include an inorganic electron transport layer high in resistance (resistivity: $1-1\times10^{11}\Omega\cdot cm$). The inorganic hole injection layer contains a metal element selected from Au, Cu, Fe, Ni, Ru, Sn, Cr, Ir, Nb, Pt, W, Mo, Ta, Pd and Co, or an oxide, an carbide, a nitride, a silicide or a boride thereof. In addition, the inorganic hole injection layer may be based on an oxide of silicon, germanium or silicon germanium. By using a stable inorganic insulation film in a part of the light-emitting body, reliability can be enhanced as a light-emitting device.

In addition, the counter electrode 512 can use an aluminum film or silver thin film containing an element belonging to group 1 or 2 of the periodic table. Moreover, the passivation film 513 can use an insulation film exhibiting of high blocking against moisture and oxygen, such as a silicon nitride film, an aluminum nitride film, a diamond-like carbon film or the like.

In fabricating a light-emitting device of the above structure, implementing the present invention makes it possible to produce a light-emitting device high in throughput by a low cost and a simple method. Furthermore, the reliability of the light-emitting device can be also improved.

Embodiment Mode 10

Figure 9:
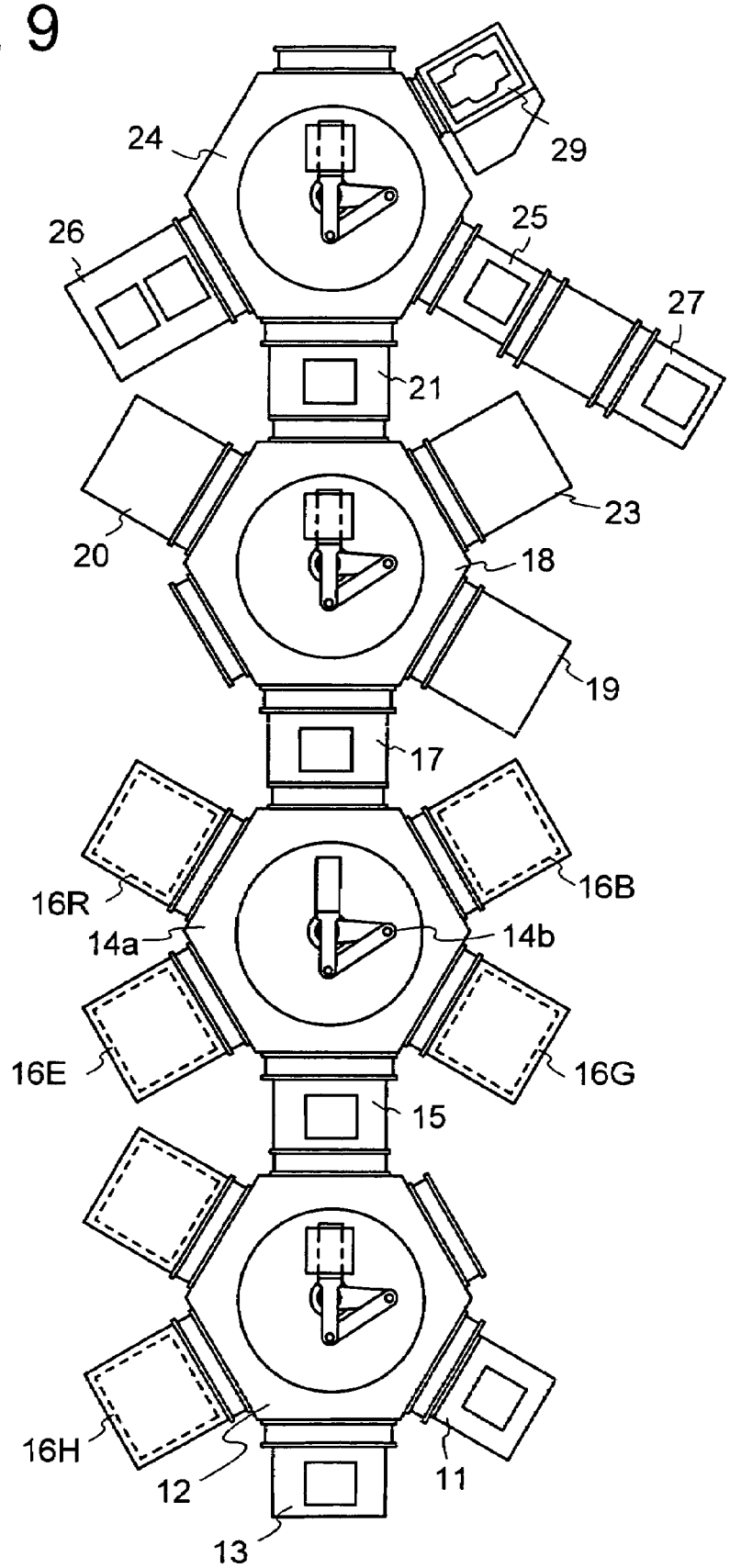
FIG. 9 is a top view of a manufacturing apparatus to be used in carrying out the present invention.

The present Embodiment Mode shows in FIG. 9 an example of a multi-chamber schemed manufacturing apparatus automated in the process of from forming a light-emitting body to sealing the light-emitting element. In FIG. 9, 11 is an accepted substrate stock chamber, 12, 14a, 18 and 24 are transport chambers (also called common chambers) for transporting a substrate to be processed into each chamber, 15, 17 and 21 are delivery chambers for delivering a substrate between the transport chambers, and 29 is a take-out chamber of a processed substrate. In addition, 13 is a pre-processing chamber, to previously clean an electrode surface or adjust a work function before forming a light-emitting body.

In addition, 16R, 16G and 16B are deposition chambers respectively for light-emitting layers corresponding to red, blue and green. 16H is a deposition chamber for a hole injection layer (HIL) or hole transport layer (HTL). 16E is a deposition chamber for an electron injection layer (EIL) or electron transport layer (ETL). By providing a solution-applying device as a characterization of the present invention in any one or a plurality of these deposition chambers, the present invention can be carried out. Incidentally, in a case where there is a need to use a spin coat method for depositing a hole injection layer, a hole transport layer, an electron injection layer or an electron transport layer, it is satisfactory to separately provide a deposition chamber for spin coating.

In addition, 19 is a deposition chamber for an oxide conductor film, 20 is a deposition chamber for depositing a metal film to turn into a cathode, and 23 is a deposition chamber for depositing an insulation film used as a passivation film. The deposition chamber 20 can be made as a deposition chamber based on an evaporation method. However, in the case of evaporation, because there is a concern that deterioration occurs in the TFT and luminescent material due to radiation such as of X-rays and electron beams, the deposition chamber is preferably based on a sputter method.

In addition, 27 is a sealing substrate load chamber for stocking a sealing substrate for sealing, 25 is a dispenser chamber for forming a seal material, and 26 is a seal chamber for bonding a processed substrate and a sealing substrate together to thereby seal the light-emitting element. Owing to the provision of these sealing chamber and the like, the manufacturing apparatus shown in the present embodiment can seal the light-emitting element without exposure of the light-emitting element in air even once, and thus it provides an effective structure in realizing a light-emitting device high in reliability.

In the manufacturing apparatus of FIG. 8, the chambers are respectively partitioned by gate valves, and this enables hermetic shield from other chambers. Furthermore, the chambers are coupled respectively to vacuum exhaust pumps, and thus allowed to maintain a vacuum and to introduce an inert gas and then provide a reduced pressure atmosphere. The vacuum exhaust pump can use a magnetic-levitation-type turbo molecule pump, a cryo-pump or a dry pump. In addition, the inert gas introduced is preferably previously passed through a refiner or the like into high purity.

Incidentally, the structure of the manufacturing apparatus shown in FIG. 9 is a mere one example, and the present invention is not limited at all. The present Embodiment Mode shows the capability of combining the solution-applying device for carrying out the manufacturing method of a light-emitting device of the present invention with a multi-chamber-schemed manufacturing apparatus, and can be carried out in a case to fabricate a light-emitting device through a combination with any structure of Embodiment Modes 1-8.

Embodiment Mode 11

Figure 10:
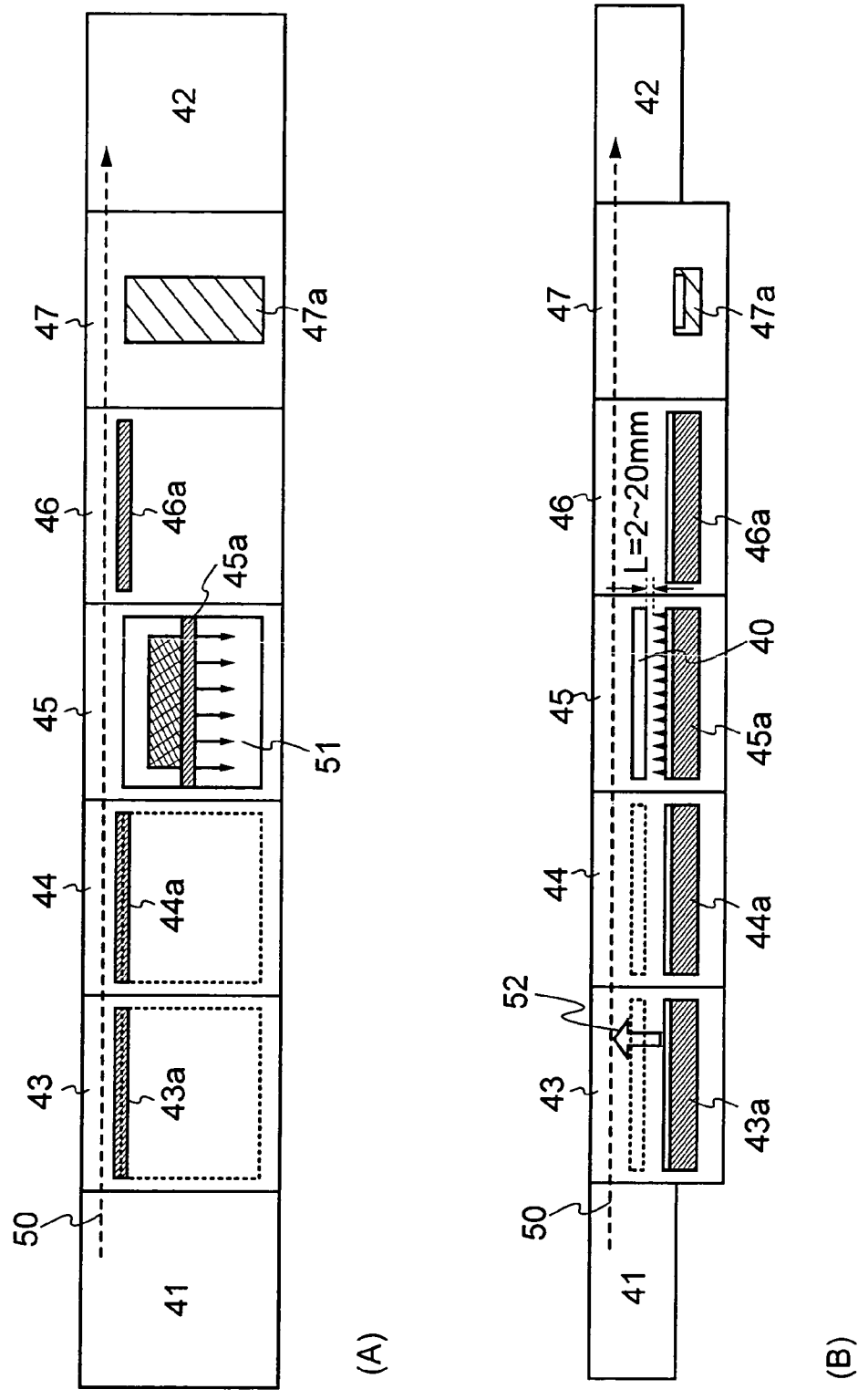
FIG. 10 is a top view and a side view of a manufacturing apparatus to be used in carrying out the present invention.

The present Embodiment Mode shows in FIG. 10 an example that an in-line schemed manufacturing apparatus for the process from forming a light-emitting body up to forming a cathode is combined with the solution-applying device used in carrying out the present invention. Incidentally, FIG. 10(A) is a top view and FIG. 10(B) is a side view.

In FIGS. 10(A) and (B), 41 is load chamber for transporting a substrate, 42 is an unload chamber for delivering a substrate, 43 is a deposition chamber for depositing a hole injection layer, 44 is a deposition chamber for depositing a hole transport layer, 45 is a deposition chamber for depositing a light-emitting layer, 46 is a deposition chamber for depositing an electron injection layer, and 47 is a deposition chamber for depositing a metal film to turn into a cathode. An arrow 50 in the figure is a transport direction of a substrate 40, and the substrate already processed is represented by the dotted line. At this time, the substrate 40 in a state where a surface to be processed is placed with the bottom up, is set up in a range of 0° to 30° relative to the horizontal plane and transported to each deposition chamber.

The deposition chambers 43-46 are respectively solution-applying devices for carrying out the present invention, within which head 43a, 44a, 45a, 46a is provided underneath the substrate. Every these heads have a structure explained in Embodiment Mode 1 or Embodiment Mode 2, to apply a solution containing an organic compound or inorganic compound and form a thin film under a reduced pressure. Of course, there may be provided a mechanism for heating the substrate 40 at room temperature (typically 20° C.) to 30° C., further preferably 50 to 200° C. An arrow 51 shows a moving direction of the head 45a, and it moves parallel with the substrate surface from one end to the other end of the substrate 40, and thus solution application and thin film formation is carried out. Incidentally, the distance (L) between the substrate 40 and a tip (ejection port) of the head 45a is 2-20 mm. The ejection of a solution containing an organic compound or an inorganic compound is ejected from the head positioned beneath the substrate, against a direction of gravity. The solute is applied onto the substrate.

In addition, in FIG. 10(B), the side view of the deposition chamber (light-emitting layer) 45 corresponds to a manner of the head moving along the substrate surface as viewed from the side surface. At this time, in the deposition chambers 43-46, there is a flow of nitrogen, inert gas and other fluorinating gas in a direction of an arrow 52. Between the substrate 40 and the head 43a-46a, a laminar flow is formed by inert gas. At this time, the flowing inert gas can be heated in place of or together with heating the substrate. Of course, it is possible to make under a reduced pressure without introducing an inert gas.

The deposition chamber 47 is a chamber for depositing a metal film to turn into a cathode by the sputter method. Deposition is carried out while the substrate 40 is passing aside a rectangular target 47a. For example, it is possible to form a metal film containing an element belonging to group 1 or 2 of the periodic table, e.g. an alloy film of aluminum and lithium. Incidentally, target 47a form is not limited to this.

Incidentally, the feature of the present invention includes a point that there is no need of a baking process and the like because thin film formation is made simultaneous with solution application. However, between the deposition chambers 43-47, may be provided a baking process of heating or the like under a reduced pressure. This is because, if a solvent component is removed from a thin film of a light-emitting layer or the like, reliability can be considered to improve correspondingly.

Embodiment Mode 12

Figure 11:
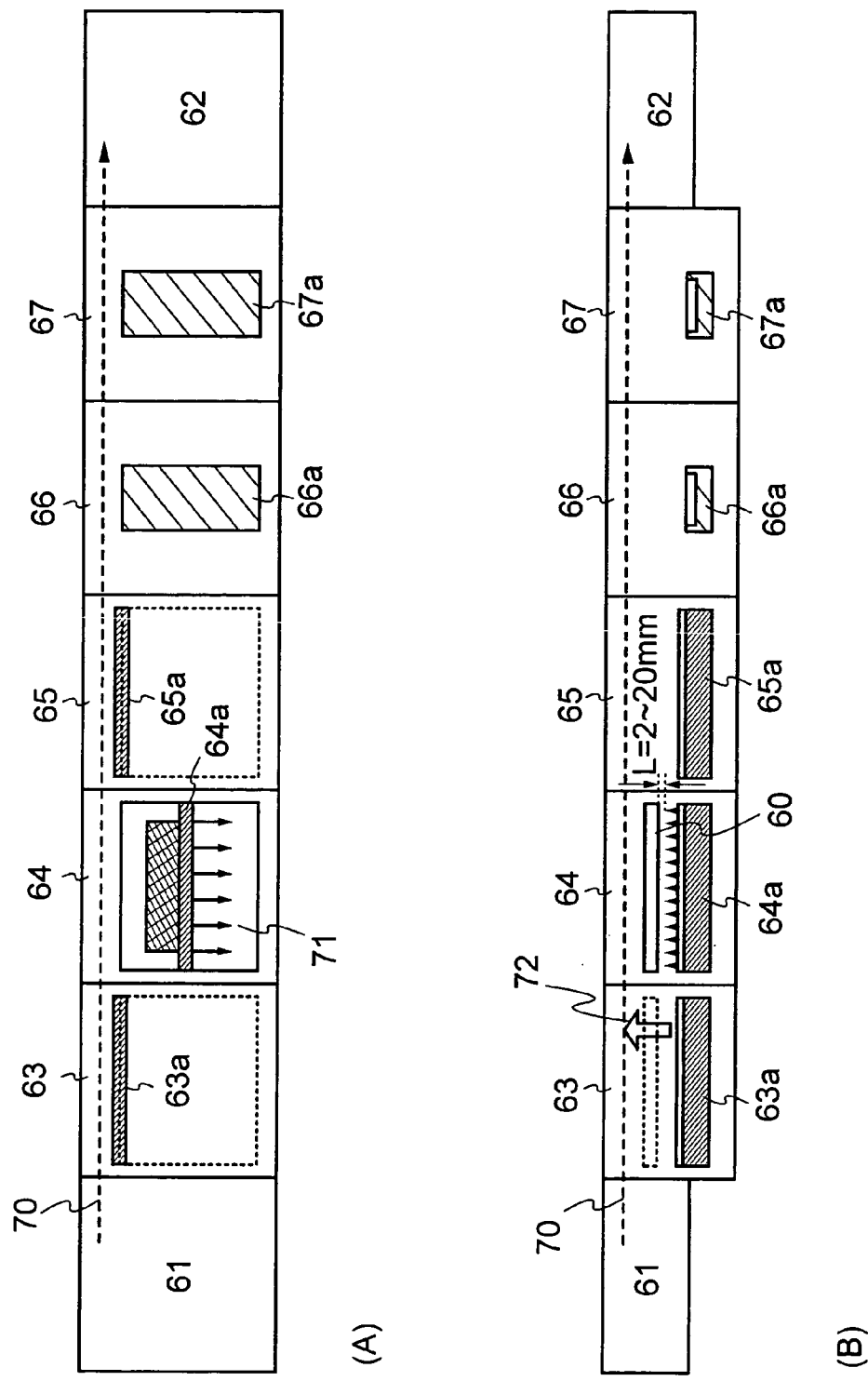
FIG. 11 is a top view and a side view of a manufacturing apparatus to be used in carrying out the present invention.

The present Embodiment Mode shows in FIG. 11 an example that an in-line schemed manufacturing apparatus for the process from forming a light-emitting body up to sealing the light-emitting element is combined with the solution-applying device used in carrying out the present invention. Incidentally, FIG. 11(A) is a top view of the manufacturing apparatus and FIG. 11(B) is a side view of the manufacturing apparatus.

In FIGS. 11(A) and (B), 61 is load chamber for transporting a substrate, 62 is an unload chamber for delivering a substrate, 63 is a deposition chamber for depositing a hole injection layer, 64 is a deposition chamber for depositing a light-emitting layer, 65 is a deposition chamber for depositing an electron injection layer, 66 is a deposition chamber for depositing a metal film to turn into a cathode, and 67 is a deposition chamber for depositing a protection film having a passivation effect. An arrow 70 in the figure is a transport direction of a substrate 60, and the substrate already processed is represented by the dotted line. At this time, the substrate 60 is placed horizontally and transported with the lower side of the substrate rendered as a surface to be processed.

The deposition chambers 63-65 are respectively solution-applying devices for carrying out the present invention, within which there is provided a head 63a, 64a, 65a. Every these heads each have a structure explained in Embodiment Mode 1 or Embodiment Mode 2, to apply a solution containing an organic compound or an inorganic compound and form a thin film under a reduced pressure. Of course, there may be provided a mechanism for heating the substrate 60 at room temperature (typically 20° C.) to 30° C., further preferably 50 to 200° C.

In addition, in FIG. 11(B), the side view of the deposition chamber (light-emitting layer) 64 corresponds to a manner of the head moving along the substrate surface as viewed from the above. An arrow 71 denotes a moving direction of the head 64a, and it moves parallel with the substrate surface from one end to the other end of the substrate 60, and thus solution application and thin film formation is carried out. Incidentally, the distance (L) between the substrate 60 and a tip (ejection port) of the head 64a is 2-20 mm.

Furthermore, at this time, in the deposition chambers 63-65, there is a flow of nitrogen, inert gas and other fluorinating gas in a direction of an arrow 72. Between the substrate 60 and the head 63a-65a, a laminar flow is formed by inert gas. At this time, the flowing inert gas can be heated in place of or together with heating the substrate. Of course, it is possible to make under a reduced pressure without introducing an inert gas.

In addition, the deposition chamber 66 is a chamber for depositing a metal film to turn into a cathode by the sputter method. Deposition is made while the substrate 60 is passing aside a rectangular target 66a. For example, it is possible to form a metal film containing an element belonging to group 1 or 2 of the periodic table, e.g. an alloy film of aluminum and lithium. Incidentally, target 66a form is not limited to this.

In addition, the deposition chamber 67 is a chamber for depositing an insulation film having a passivation effect by the sputter method (preferably radio-frequency sputter method). Deposition is made while the substrate 60 is passing aside a rectangular target 67a in the same manner as in Embodiment Mode 7. For example, it is possible to form silicon compound film high in compactness, such as a silicon nitride film, a silicon nitride oxide film. Incidentally, target 67a form is not limited to this.

Incidentally, the feature of the present invention includes a point that there is no need of a baking process and the like because thin film formation is made simultaneous with solution application. However, between the deposition chambers 63-66, may be provided a baking process of heating or the like under a reduced pressure. This is because, if a solvent component is removed from a thin film of a light-emitting layer or the like, reliability can be considered to improve correspondingly.

Embodiment Mode 13

Figure 12:
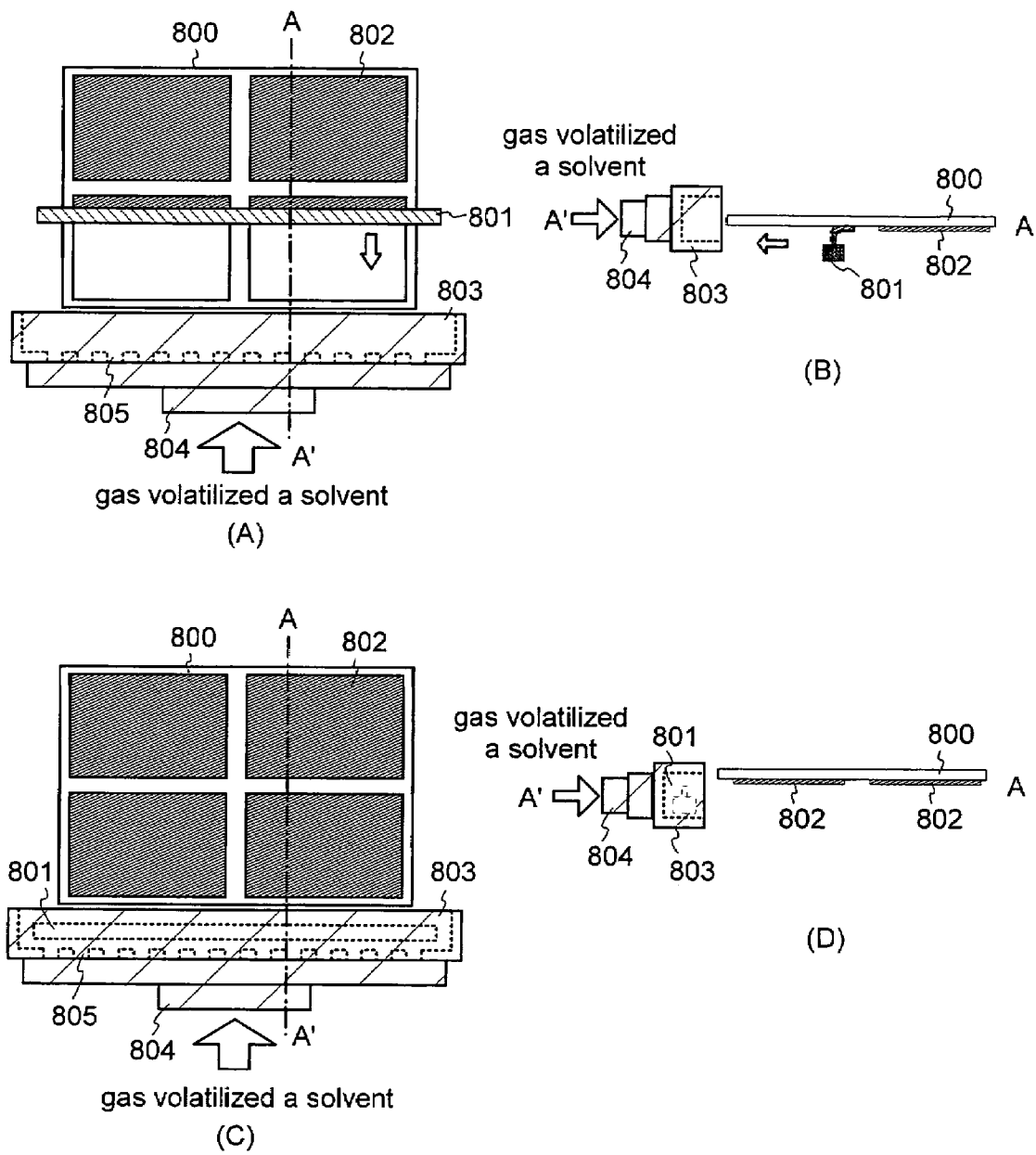
FIG. 12 is a view showing a fabrication method of a light-emitting device in the present invention.

The defect of ink-jet scheme lies in that, when ejection of a solution is ceased, the solvent volatilizes and dries at the ejection port to thereby cause clogging in the head of the ejection port. One of the conventional methods for preventing this is to prevent against drying by continuously ejecting the solution at all times. Accordingly, because the solution is wastefully ejected and discharged, the utilization efficiency of a light-emitting body composition lowers. The present Embodiment Mode explains means for preventing the head of the ejection port from drying, by using FIG. 12.

FIGS. 12(A) and (B) are views of a manufacturing process of a light-emitting body in the present Embodiment Mode as viewed from the below and the lateral of the substrate, respectively. A head 801 of a solution-applying device positioned underneath a substrate 800 is scanned toward an arrowed direction. From the head 801, a solution containing a light-emitting body composition is ejected in the form shown in Embodiment Modes 1-3, to form a light-emitting body 802 without the need to especially provide a baking process. At this time, the present Embodiment Mode is characterized in that a container part 803 for containing the head 801 after scanning is provided alongside the substrate 800. The interior thereof is filled with a gas volatilized a solvent. The gas volatilized a solvent (gas containing a solvent component), after introduced from an introduction port 804, is filled within the container part 803 through a plurality of openings 805 positioned underneath the container part 803.

Incidentally, the "gas volatilized a solvent" is a solvent capable of dissolving a light-emitting body to be formed, which is preferably the same one as the solvent of a solution containing a light-emitting body composition ejected at the head 801. Of course, there is no necessity to limit it to the same one. Proper change may be made depending upon the kind of a light-emitting body to form.

In FIG. 12(C), (D) is shown a state of the head 801 at a time the forming process of a light-emitting body is ended. As shown in FIG. 12(C), (D), the head 801 is accommodated in a manner completely hidden within the container part 803, and thus exposed to a solvent gas atmosphere. At this time, it is effective to provide a lid on the container part 803 so that, after the head 801 is accommodated, the lid is closed to suppress the solvent component from diffusing to the outside. Of course, because the head is fixed and scanned by a not shown support material or the like, the lid is naturally closed by avoiding it.

As above, the present Embodiment Mode is characterized in that, after ending the forming process of a light-emitting body, the head is exposed to an atmosphere filled with a solvent capable of dissolving a light-emitting body to be formed. Due to this, in the ejection port of the head 801, because the light-emitting body composition is dissolved by the solvent, clogging does not occur due to drying or the like. Namely, because of an environment free from drying even if ejection of the light-emitting body composition ceases, there is no need to usually eject a solution continuously and thereby prevent from drying like a conventional ink-jet scheme. Therefore, the ratio of discharge by wasteful ejection is reduced, and thus the utilization efficiency of a light-emitting body composition can be improved.

Incidentally, the technical idea that, after application, the head is exposed to the atmosphere filled with the solvent component and prevented from drying can be naturally applied to a case the surface to be processed is taken above the substrate or a case the substrate is placed perpendicularly.

In addition, the present Embodiment Mode can be combined with a manufacturing apparatus including any structure of Embodiment Modes 4, 5, 10-12, and used in a fabrication method of a light-emitting device including any structure of Embodiment Modes 7-9.

Embodiment Mode 14

The present Embodiment Mode explains a head structure of a solution-applying device used in a fabrication method of a light-emitting device according to the present invention, by using FIG. 13. Incidentally, the present Embodiment Mode takes a form to apply a substrate horizontally placed with the surface to be processed positioned lower (corresponding to Embodiment Modes 10, 11). However, it is needless to say that practicing is possible in a case the surface to be processed is positioned upper of the substrate or a case the substrate is positioned perpendicularly.

In FIG. 13(A), a substrate 901 is supported with a suscepter 902 of a magnetic body and placed horizontal with the surface to be processed positioned lower. A head 903 of a solution-applying device is provided close to a surface of the substrate 901. At this time, the magnifying part at a tip of a nozzle (ejection port) 904 is shown by a dotted-lined part 905. The nozzle interior is in a hollow structure, having a core 906 fixed further inward thereof and a cap (hereinafter, referred to as a magnetic body cap) 908 made by a magnetic body coupled to the core 906 through an elastic body (spring in the present Embodiment Mode) 907. A solution 909 containing a light-emitting body composition is filled outside the hollow structure.

The magnetic body cap 908 selects such a material that a repulsive force acts against the suscepter 902 of a magnetic body. In the case of FIG. 13(A), the distance (X1) between the substrate 901 and the magnetic body cap 908 is a distance that a repulsive force does not effectively acts between the susceptor 902 and the magnetic body cap 908, which is determined by a material of a magnetic body, a substrate thickness, etc. In the case that a repulsive force does not effectively acts between the suscepter 902 and the magnetic body cap 908, the magnetic body cap 908 is urged by the elastic body 907 and plugged in the tip of the nozzle 904, to prevent the solution 909 containing a light-emitting body composition from ejecting.

In addition, after commencing solution application, the distance between the substrate 901 and the magnetic body cap 908 is reduced to X2, as shown in FIG. 13(B). This distance X2 is a distance that a repulsive force fully acts between the suscepter 902 and the magnetic body cap 908. By this repulsive force, the magnetic body cap 908 compresses the elastic body 907 and is pushed into an inside of the hollow structure. Due to this, a space is secured at the tip of the nozzle 904, to eject the solution 909 containing a light-emitting body composition. In this manner, the solution 909 containing a light-emitting body composition is applied to a surface of the substrate 901. The solvent is volatilized under a reduced pressure or the solvent is volatilized by the heat of the substrate 901, and thereby a light-emitting body 910 is formed.

As the above, by using a magnetic body in such a relationship as causing to act a repulsive force on both of the suscepter and the nozzle-tip cap, it is possible to take a structure for applying an internal solution when approached to a certain constant distance, making it possible to secure a uniformity in a distance between the substrate and the head (exactly, nozzle). In addition, by controlling the distance between the substrate and the head, ejection can be controlled on-off. This technique is effective particularly in applying a solution onto a substrate having concavity and convexity.

Incidentally, the present Embodiment Mode can be combined with a manufacturing apparatus including any structure of Embodiment Modes 4, 5, 10-13. Moreover, it can be used in a manufacturing method of a light-emitting device including any structure of Embodiment Modes 7-9.

Embodiment Mode 15

Figure 14:
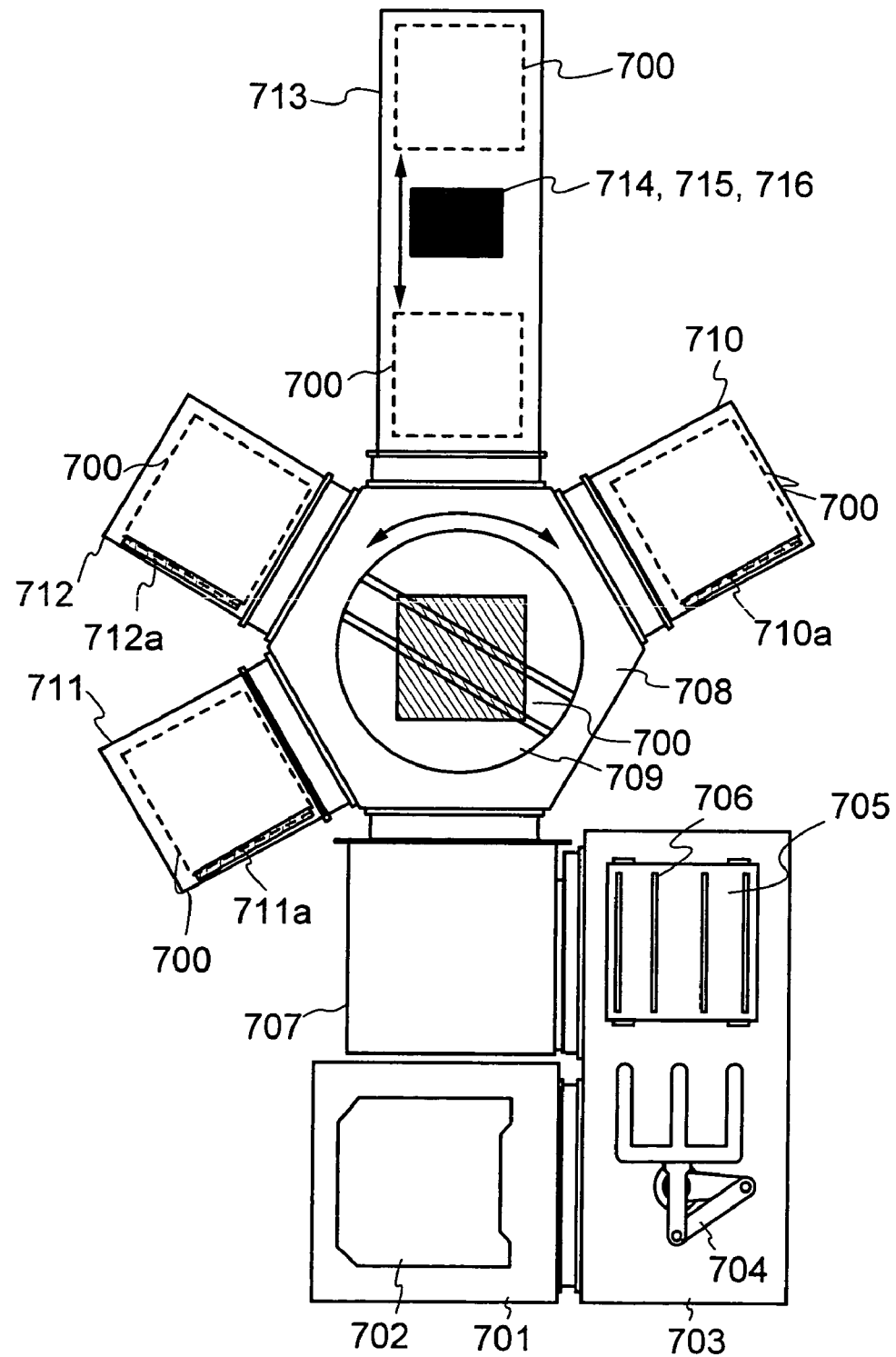
FIG. 14 is a top view of a manufacturing apparatus to be used in carrying out the present invention.

The present Embodiment Mode explains an example using a multi-chamber schemed manufacturing apparatus, in a light-emitting device manufacturing apparatus for substrate transportation and deposition as shown in Embodiment Modes 13 and 14, by using FIG. 14. Incidentally, the chambers are mutually coupled by gate valves, to thereby keep a hermetic state.

In FIG. 14, a carrier 702 for transporting a substrate is set up in a stock chamber 701. The stock chamber 701 is coupled to a transport chamber 703 through the gate valve. The substrate furnished on the carrier 702 is transported by a transport arm 704 and placed on a substrate mounting table 705. At this time, the substrate is first rested on a pusher pin 706 and thereafter the pusher pin 706 is lowered to place the substrate on the substrate mounting table 705. The substrate mounting table 705 after fixing the substrate moves to an inside of a load/unload chamber 707, to deliver the substrate to a suscepter 700. Incidentally, in FIG. 14, the part that the suscepter 700 is represented by the dotted line means that the substrate in processing positions there but the substrate and the suscepter moves in unison as the process proceeds so that it currently does not exist there.

The substrate delivered in the load/unload chamber 707 moves in unison with the suscepter 700 along a rail, and thus is transported to a common chamber 708 coupled by the gate valve. A turntable 709 is provided within the transport chamber 708. When the suscepter 700 rests upon the turntable 709, the turntable 709 rotates to select a chamber to carry out the next process, coupled to the common chamber through the gate valve.

The manufacturing apparatus in the present Embodiment Mode is provided, as processing chambers, with a deposition chamber (HTL deposition chamber) 710 for depositing a hole transport layer (HTL), a deposition chamber (light-emitting layer deposition chamber) 711 for depositing a light-emitting layer, a deposition chamber (ETL deposition chamber) 712 for depositing an electron transport layer (ETL), and a deposition chamber (sputter deposition chamber) 713 for depositing a conductor film by a sputter method. The deposition chambers 710-712 for forming a light-emitting body are each provided with a solution-applying device explained in Embodiment Modes 1-3, which are chambers for depositing a light-emitting body composition by solution application such as inkjet. Incidentally, in each chamber, heads 710a-712a of solution-applying device is provided underneath the substrate. These heads are scanned parallel with the substrate while ejecting a solution in a direction toward the substrate, thereby forming a thin film.

In addition, the deposition chamber 713 for depositing a cathode by a sputter method is provided with electrodes 714, 715 and target 716 for sputtering. These are all in a cylindrical or hyperelliptic form. The substrate attached on the suscepter 700 is transported in the arrow direction, to which deposition is made while passing aside the target 716. At this time, the sputter method may use any of DC (direct current) sputter method and RF (alternating current) sputtering method.

The substrate (suscepter) ended the process at each chamber is returned to the load/unload chamber 707, and accommodated in the carrier 702 through the substrate mounting table 705 and the like. By the above, completed is the process up to forming a cathode of a light-emitting element. Incidentally, although the present Embodiment Mode explained the manufacturing apparatus for carrying out the process up to forming a cathode, the number of chambers can be increased to complete passivation film (protection film) formation and seal process by a seal can or the like. Moreover, the light-emitting body structure is not limited to this Embodiment Mode but can be applied to a composite form as shown in Embodiment Mode 6. In such a case, it is satisfactory to change the number of chambers, the processing content in the deposition chamber and others.

Incidentally, the present Embodiment Mode may have the structure of Embodiment Modes 4, 5 and can be used in fabricating a light-emitting device described in Embodiment Modes 8, 9. Furthermore, the deposition chamber may be applied by the structure of Embodiment Modes 13, 14.

Embodiment Mode 16

Figure 15:
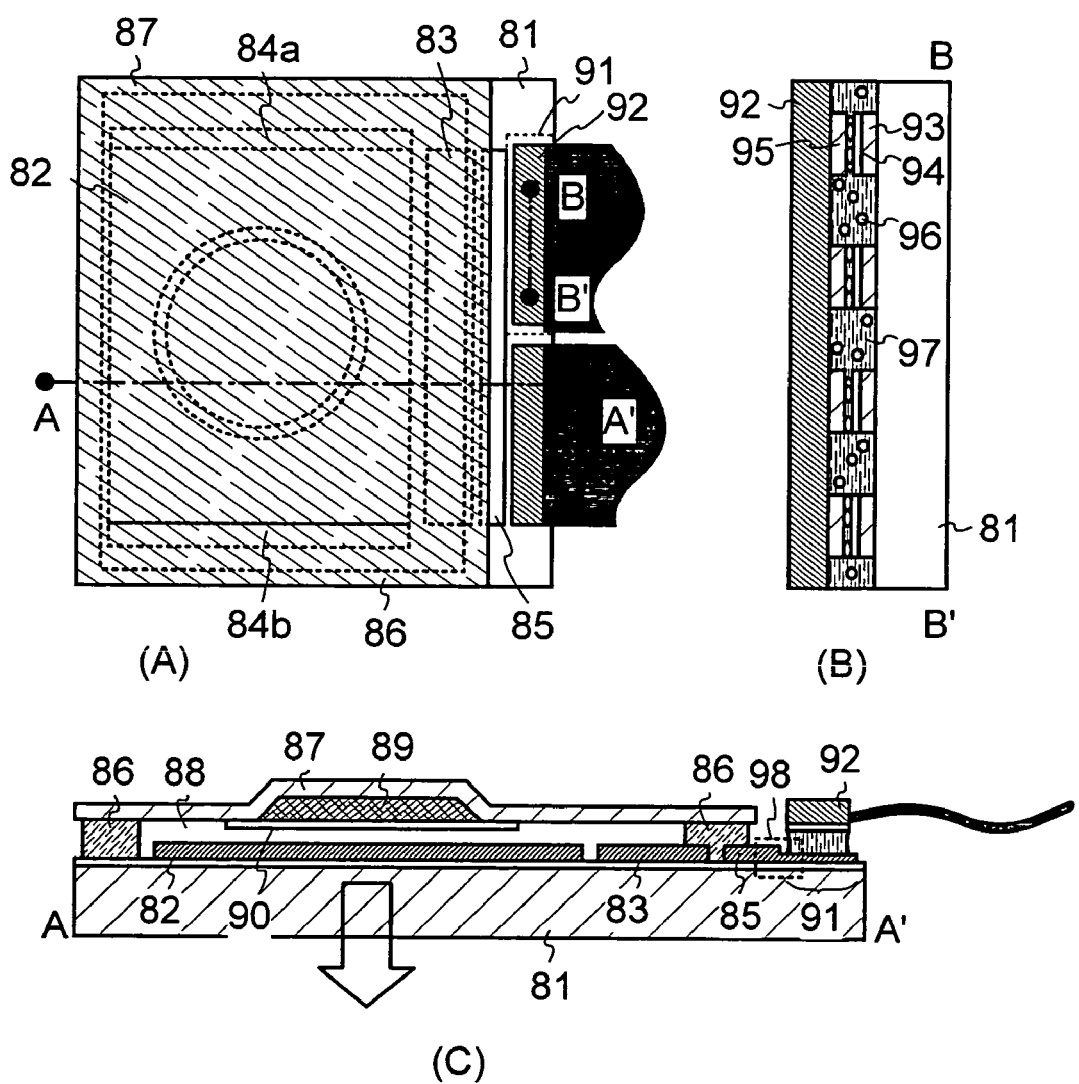
FIG. 15 is a view showing an exterior view of a light-emitting device obtained in carrying out the present invention.

This Embodiment Mode explains the overall structure of a light-emitting device fabricated by carrying out the present invention, by using FIG. 15. FIG. 15 is a top view of a light-emitting device formed by sealing through a seal material a device substrate on which a thin film transistor is formed. FIG. 15(B) is a sectional view on B-B' in FIG. 15(A), and FIG. 15(C) is a sectional view on A-A' in FIG. 15(A).

On the substrate 81, there are arranged a pixel part (display part) 82, a data line drive circuit 83 provided in a manner surrounding the pixel part 82, gate line drive circuits 84a, 84b and a protection circuit 85. A seal material 86 is provided in a manner surrounding those. The pixel part 82 has a light-emitting element fabricated by carrying out the present invention. The seal material 86 can use a UV setting resin, an epoxy resin or other resin but preferably use a material possibly low in wettability. Incidentally, the seal material 86 may be provided superposed over a part of the data line drive circuit 83, gate line drive circuit 84a, 84b and protection circuit 85, or provided avoiding those circuits.

A sealing member 87 is bonded by the use of the seal material 86, to form a hermetic space 88 by the substrate 81, the seal material 86 and the sealing member 87. The sealing member 87 can use a glass material, a metal material (typically, stainless steel), a ceramics material or plastics (including a plastic film). In addition, sealing is possible by only an insulation film as shown in Embodiment Mode 8.

Incidentally, where the sealing member 87 uses a material different from the substrate 81, there is a possibility to spoil the adhesion of the seal material 86 due to a difference in thermal expansion coefficient. Accordingly, the sealing member 87 preferably uses the same material as the substrate 81 for forming transistors thereon. In other words, it is desired to use a substrate having the same thermal expansion coefficient as the substrate 81. In the present embodiment, glass is used as a material of the substrate 81 and sealing member 87. Furthermore, the sealing member 87 is regulated in thermal expansion coefficient by being passed the same thermal history as the thermal history of the substrate 81 in a transistor fabrication process.

A absorbent (barium oxide, calcium oxide, or the like) 89 is previously provided in a recess of the sealing member 87, to absorb moisture, oxygen and the like and keep a clean atmosphere within the hermetic space 88, thus playing a role to suppress the EL layer from deteriorating. This recess is covered with a cover 90 in a finely meshed form. The cover 90 passes air and moisture but does not pass the absorbent 89. Incidentally, the hermetic space 88 may be filled with an inert gas, such as nitrogen or argon. Filling can be by a resin or a liquid if inactive.

In addition, on the substrate 81, a terminal 91 is provided for conveying a signal to the data line drive circuit 83 and gate line drive circuit 84a, 84b. To the terminal 91, a data signal such as a video signal is conveyed through an FPC (flexible printed circuit) 92. The terminal 91 has a section as FIG. 15(B), wherein electrical connection is provided by use of a resin 97 dispersed with conductor 96 between a wiring in a structure laying an oxide conductor film 94 on a wiring 93 formed simultaneously with the gate line or data line and a wiring 95 provided close to the FPC 92. Incidentally, the conductor 96 may use a spherical polymer compound plated with gold or silver.

In the present Embodiment Mode, the protection circuit 85 is provided between the terminal 91 and the data line drive circuit 83. When static electricity such as a surge pulse signal enters between the both, the role is played to release the pulse signal to the outside. At that time, a high voltage signal first instantaneously entered is blunted by a capacitor. The other high voltage can be released to the outside by a circuit structured by use of thin film transistors or thin film diodes. Of course, the protection circuit may be provided in other place, e.g. between the pixel part 82 and the data line drive circuit 83 or between the pixel part 82 and the gate line drive circuits 84a, 84b.

Embodiment Mode 17

Although the structures of the thin film transistors shown in Embodiment Modes 8, 9 are both top-gate structures (specifically, planar structures), a bottom-gate structure (specifically, an inverted staggered structure) can be provided in each embodiment.

Naturally, not limited to the thin film transistor, application may be to a transistor in a MOS structure formed using a silicon-well. Furthermore, besides the thin film transistor, application may be to a case using a diode element (also called a two-terminal element) represented by a MIM (Metal-Insulator-Metal) element or the like.

In any way, the present invention even when carried out in fabricating an active-matrix type light-emitting device is not impaired in its native effect by a switching element structure such as a transistor structure.

Embodiment Mode 18

Figure 16:
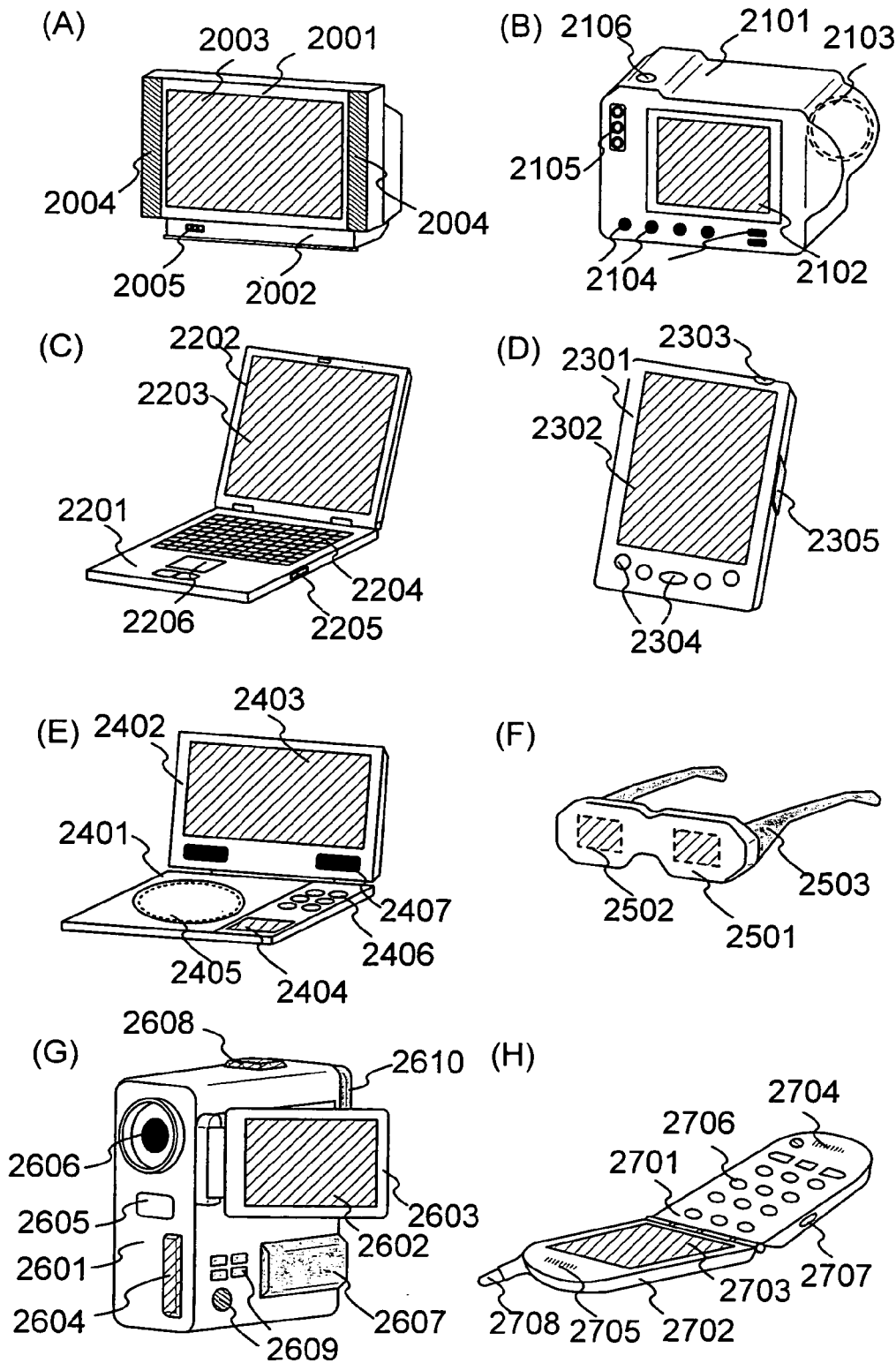
FIG. 16 is a view showing an example of electronic appliances having a light-emitting device obtained by carrying out the present invention.

By incorporating a light-emitting device obtained by carrying out the present invention in a display portion, an electronic appliance can be fabricated. The electronic appliance includes a video camera, a digital camera, a goggle-type display (a head mounted display), a navigation system, an audio reproducing apparatus (a car audio, an audio component, etc.), a notebook personal computer, a game apparatus, a personal digital assistant (a mobile computer, a cellular phone, a portable game machine, an electronic book, etc.), an image reproducing apparatus having a recording medium (specifically, an apparatus for reproducing a recording medium such as a digital versatile disc (DVD) and having a display for displaying an image thereof), and so on. The concrete examples of those electronic appliances are shown in FIG. 16.

FIG. 16(A) is a television set including a housing 2001, a support base 2002, a display portion 2003, a speaker 2004, a video input terminal 2005, and the like. The present invention can be applied to the display portion 2003. Incidentally, included are all the television for displaying information set for personal computers, for receiving TV broadcast, for advertisement display, etc.

FIG. 16(B) is a digital camera including a main body 2101, a display portion 2102, an image receiver 2103 operation keys 2104, an external connection port 2105, a shutter 2106, etc. The present invention can be applied to the display portion 2102.

FIG. 16(C) is a notebook type personal computer including a main body 2201, a housing 2202, a display portion 2203, a keyboard 2204, an external connection port 2205, a pointing mouse 2206, etc. The present invention can be applied to the display portion 2203.

FIG. 16(D) is a mobile computer including a main body 2301, a display portion 2302, a switch 2303, operation keys 2304, an infrared-ray port 2305, etc. The present invention can be applied to the display portion 2302.

FIG. 16(E) is a portable-type image reproducing apparatus (specifically, a DVD reproducing apparatus) having a recording medium, including a main body 2401, a housing 2402, a display portion A 2403, a display portion B 2404, a recording medium (DVD, etc.) reader portion 2405, an operation key 2406, a speaker 2407, etc. The display portion A 2403 displays mainly image information, and the display portion B 2404 displays mainly character information. The present invention can be applied to the display portions A 2403, B 2404. Incidentally, the image reproducing apparatus having a recording medium include a household game apparatus.

FIG. 16(F) is a goggle-type display (a head mounted display) including a main body 2501, a display portion 2502 and an arm portion 2503. The present invention can be applied to the display portion 2502.

FIG. 16(G) is a video camera including a main body 2601, a display portion 2602, a housing 2603, an external connection port 2604, a remote control receiver 2605, a receiver 2606, a battery 2607, an audio input 2608, operation keys 2609 and an eyepiece 2610. The present invention can be applied to the display portion 2602.

FIG. 16(H) is a cellular phone including a main body 2701, a housing 2702, a display portion 2703, an audio input 2704, an audio output 2705, an operation key 2706, an external connection port 2707 and an antenna 2708. The present invention can be applied to the display portion 2703. Incidentally, the display portion 2703 can suppress consumption current for the cellular phone by displaying white characters on a black background.

As described above, the display device obtained by carrying out the present invention may be used as a display portion of every electronic appliance. Incidentally, the electronic appliance in the present Embodiment Mode may use a light-emitting device fabricated by using any structure of Embodiment Modes 1-3 and 6-8.

INDUSTRIAL APPLICABILITY

The present invention enables to form a thin film nearly simultaneously with applying a solution containing a light-emitting body composition of an organic compound, an inorganic compound or the like, and makes it possible to greatly improve the throughput in a manufacturing process of a light-emitting device.

In addition, the solvent component in a formed thin film can be fully removed simultaneously with film forming. Accordingly, it is possible to avoid such a disadvantage that the light-emitting layer itself deteriorates due to degasification after a light-emitting element is completed, and to improve the reliability of the light-emitting device.

The invention claimed is:

1. A fabrication method of a light-emitting device comprising the steps of:

ejecting a first solution containing a carrier injection material or a carrier transporting material from below toward an anode or a cathode facing downward under a pressure lower than atmosphere pressure;

forming a first thin film by depositing the carrier injection material or the carrier transporting material on the anode or the cathode;

ejecting a second solution containing a luminescent material from below toward the anode or the cathode facing downward under a pressure lower than atmosphere pressure; and forming a second thin film by depositing the luminescent material on the first thin film.

2. A fabrication method of a light-emitting device according to claim 1, wherein under the pressure lower than atmosphere pressure is in an inert gas atmosphere at $1\times10^3$ to $1\times10^5$ Pa.

3. A fabrication method of a light-emitting device according to claim 1, wherein the first thin film is formed in a first deposition chamber of a multi chamber, wherein the second thin film is formed in a second deposition chamber of the multi chamber, wherein the first thin film and the second thin film are formed in the multi chamber without exposure of the first thin film and the second thin film in air, and wherein the first deposition chamber and the second deposition chamber each includes heads of solution-applying device.

4. A fabrication method of a light-emitting device according to claim 1, wherein the anode or the cathode is set up in a range of 0° to 30° relative to a horizontal plane.

5. A fabrication method of a light-emitting device comprising the steps of:

ejecting a first solution containing a carrier injection material or a carrier transporting material from below toward an anode or a cathode facing downward under a pressure of $1\times10^2$ to $1\times10^5$ Pa;

forming a first thin film by depositing the carrier injection material or the carrier transporting material on the anode or the cathode;

ejecting a second solution containing a luminescent material from below toward the anode or the cathode facing downward under a pressure of $1\times10^2$ to $1\times10^5$ Pa; and forming a second thin film by depositing the luminescent material on the first thin film.

6. A fabrication method of a light-emitting device according to claim 5, wherein under the pressure lower than atmosphere pressure is in an inert gas atmosphere at $1\times10^3$ to $1\times10^5$ Pa.

7. A fabrication method of a light-emitting device according to claim 5, wherein the first thin film is formed in a first deposition chamber of a multi chamber, wherein the second thin film is formed in a second deposition chamber of the multi chamber, wherein the first thin film and the second thin film are formed in the multi chamber without exposure of the first thin film and the second thin film in air, and wherein the first deposition chamber and the second deposition chamber each includes heads of solution-applying device.

8. A fabrication method of a light-emitting device according to claim 5, wherein the anode or the cathode is set up in a range of 0° to 30° relative to a horizontal plane.

9. A fabrication method of a light-emitting device comprising the steps of:

ejecting a first solution containing a carrier injection material or a carrier transporting material from below toward an anode or a cathode facing downward under a pressure lower than atmosphere pressure; and forming a first thin film by depositing a remaining of the carrier injection material or the carrier transporting material on the anode or the cathode and volatilizing a first solvent in the first solution in a first duration before the first solution arrives at the anode or the cathode;

ejecting a second solution containing a luminescent material from below toward the anode or the cathode facing downward under a pressure lower than atmosphere pressure; and forming a second thin film by depositing the luminescent material on the first thin film and volatilizing a second solvent in the second solution in a second duration before the second solution arrives at the first thin film.

10. A fabrication method of a light-emitting device according to claim 9, wherein under the pressure lower than atmosphere pressure is in an inert gas atmosphere at $1\times10^3$ to $1\times10^5$ Pa.

11. A fabrication method of a light-emitting device according to claim 9, wherein the first thin film is formed in a first deposition chamber of a multi chamber, wherein the second thin film is formed in a second deposition chamber of the multi chamber, wherein the first thin film and the second thin film are formed in the multi chamber without exposure of the first thin film and the second thin film in air, and wherein the first deposition chamber and the second deposition chamber each includes heads of solution-applying device.

12. A fabrication method of a light-emitting device according to claim 9, wherein the anode or the cathode is set up in a range of 0° to 30° relative to a horizontal plane.

\* \* \* \* \*